US010616073B1

(12) United States Patent
Pierce

(10) Patent No.: US 10,616,073 B1
(45) Date of Patent: Apr. 7, 2020

(54) GRAPH-BASED SERVICE FAILURE ANALYSIS

(71) Applicant: Amazon Technologies, Inc., Reno, NV (US)

(72) Inventor: Lucas Shane Pierce, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 918 days.

(21) Appl. No.: 14/032,104

(22) Filed: Sep. 19, 2013

(51) Int. Cl.
*H04L 12/24* (2006.01)
*G06F 17/50* (2006.01)

(52) U.S. Cl.
CPC ........ *H04L 41/145* (2013.01); *G06F 17/5009* (2013.01)

(58) Field of Classification Search
CPC .... G06F 11/079; G06F 11/0709; H04L 41/12; H04L 12/66; H04L 41/145; H04L 41/22; H04L 43/08
See application file for complete search history.

(56) References Cited

U.S. PATENT DOCUMENTS

| | | | | |
|---|---|---|---|---|
| 6,970,919 B1* | 11/2005 | Doi | ..................... | H04L 41/0631 345/440 |
| 8,010,643 B2* | 8/2011 | Gray | ................... | H04L 12/4641 370/252 |
| 8,095,819 B2* | 1/2012 | Watanabe | ........... | G06F 11/0709 714/4.1 |
| 8,577,663 B2* | 11/2013 | Lu | ...................... | G05B 23/0235 703/13 |
| 9,026,654 B2* | 5/2015 | Meloche | ................. | H04L 41/12 709/223 |
| 9,131,529 B1* | 9/2015 | Ayyagari | .............. | H04W 84/06 |
| 2004/0078683 A1* | 4/2004 | Buia | ....................... | H04L 12/66 714/37 |
| 2005/0169185 A1* | 8/2005 | Qiu | ...................... | H04L 41/145 370/241 |
| 2010/0005051 A1* | 1/2010 | Agrawal | ................ | G06N 5/022 706/55 |
| 2010/0074141 A1* | 3/2010 | Nguyen | .................. | H04L 41/12 370/254 |
| 2011/0054962 A1* | 3/2011 | Xu | ......................... | G06Q 10/00 705/7.11 |

(Continued)

OTHER PUBLICATIONS

Phillips, Cynthia, and Laura Painton Swiler. "A graph-based system for network-vulnerability analysis." In Proceedings of the 1998 workshop on New security paradigms, pp. 71-79. ACM, 1998.*

*Primary Examiner* — Aniss Chad
(74) *Attorney, Agent, or Firm* — Davis Wright Tremaine LLP

(57) ABSTRACT

Techniques for representing, analyzing, altering and reporting the results of the analysis and/or alteration of a system with a plurality of system elements and one or more relationships between those system entities are described herein. A representation of the system is created with nodes that correspond to the system entities and edges that correspond to relationships between pairs of system entities. A simulation is performed on the representation to obtain information about system failures, the representation is altered, and a second simulation is performed to obtain information about system failures in the new representation. Results are reported about the results before and after the alterations.

20 Claims, 19 Drawing Sheets

(56) References Cited

U.S. PATENT DOCUMENTS

| | | | | |
|---|---|---|---|---|
| 2012/0023044 A1* | 1/2012 | Anerousis | ............ | G06N 5/043 706/12 |
| 2012/0183294 A1* | 7/2012 | Boertjes | ............ | H04J 14/0204 398/49 |
| 2014/0325279 A1* | 10/2014 | Suriyanarayanan | .... | H04L 43/12 714/37 |

* cited by examiner

GRAPH-BASED SERVICE FAILURE ANALYSIS

BACKGROUND

System availability and stability are highly significant in most modern computing systems. In distributed and/or virtualized computing systems, where a plurality of computer system entities may use shared computer system resources, when those shared computer system resources become scarce or unavailable, the various computer system entities may experience system slowdowns and outages. These slowdowns and outages may become more prevalent when the shared computer system resources are unique, come from a single provider or are critically or logically important. In such distributed and/or virtualized computing systems, where shared computer system resources may be shared by a large number of computer system entities, the loss of a single resource may adversely affect a large portion of a system. Similarly, such distributed and/or virtualized computing systems are often highly interconnected, and in such highly interconnected computing systems, loss of a portion of a computing system may affect other portions of the computing system, causing further adverse effects.

BRIEF DESCRIPTION OF THE DRAWINGS

Various embodiments in accordance with the present disclosure will be described with reference to the drawings, in which.

DETAILED DESCRIPTION

Figure 1:
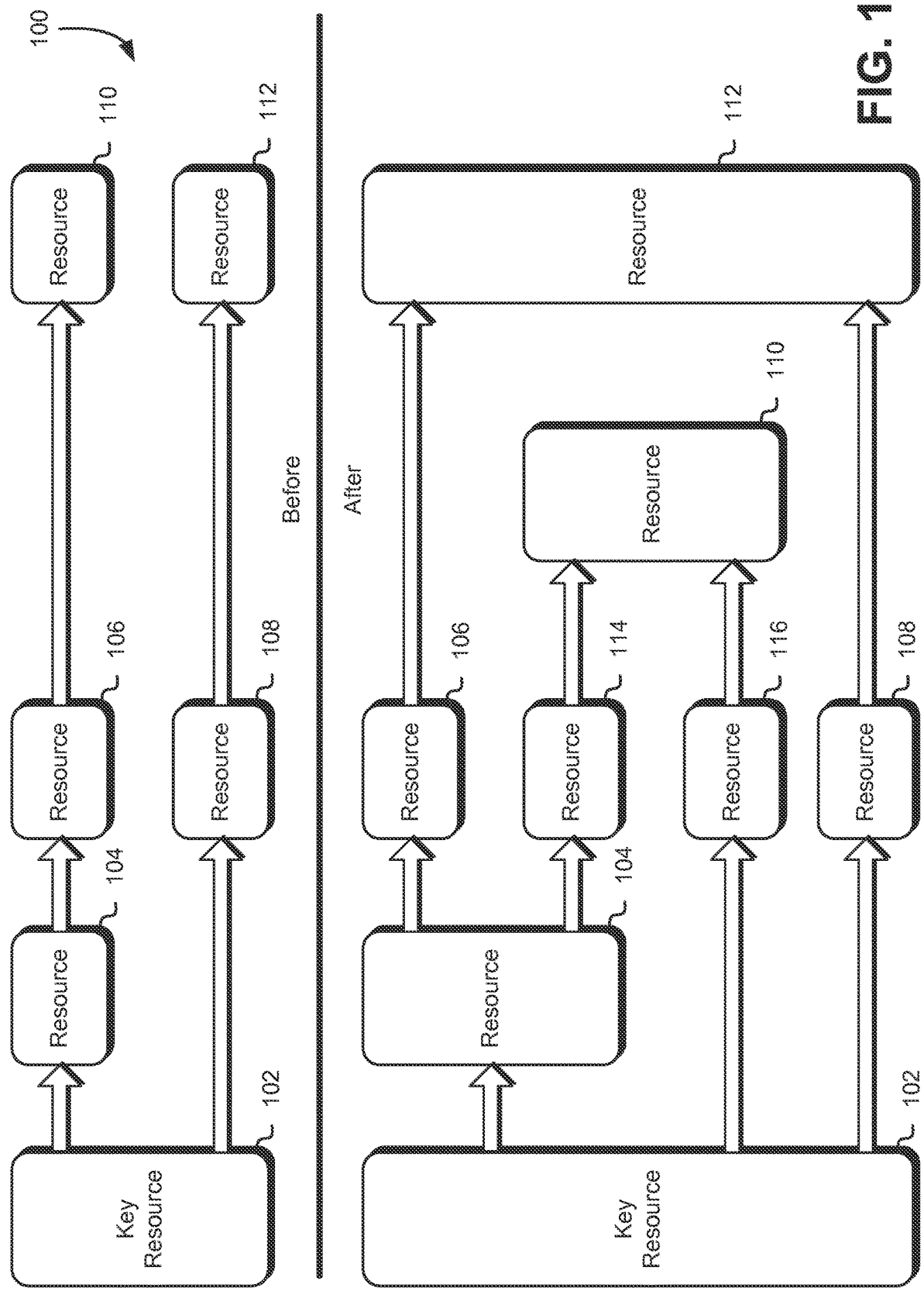
FIG. 1 illustrates an example environment in which dependencies between entities in distributed and/or virtualized computer systems may be represented, analyzed and/or optimized in accordance with at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include methods, systems and processes for analyzing and managing resources on computing systems and executable code operating thereon. In particular, techniques are disclosed for utilizing processor capabilities to facilitate analysis and management of system resources such as logical systems, virtual and physical computing entities, hardware, networks, storage, cooling, power and power supplies, racks, data center rooms, data centers and the like, where these resources may be shared by various computer system entities running on distributed and/or virtual computing systems. In such computing systems, knowledge about the structure of the system as well as methods to analyze, alter, add to, remove from and/or redistribute elements of that structure provide valuable techniques to help increase the operational efficiency of the computer system. For example, computing systems may be tuned for performance based at least in part on, among other factors, an assumption that resources will be made available at certain times and/or for certain purposes. Effective analysis of a system structure may provide valuable predictions about the likely availability of resources and may help to identify vulnerabilities to system failures and corresponding vulnerabilities in resource availability, thereby potentially helping to ensure resource availability and/or mitigate resource unavailability. In some embodiments, resource unavailability may occur because of, for example, scheduled system maintenance, system upgrades, software system upgrades, and/or the like. In such examples, knowledge about which dependent components that may be adversely impacted by such maintenance on a resource or entity may allow notification and/or migration of those dependent resources or entities.

In an illustrative example, consider a first computer system or service for completing a purchase. Such a purchase system may rely on computer hardware, system storage, networking, power, cooling and such in order to operate. If, for example, the power goes out, the computer system may not function. Similarly, if the network goes out, customers may not be able to connect to the system and thus, the system may also not function. Such a system may also rely on other systems. The purchase system may complete a purchase by, for example, verifying customer credit card numbers. In some distributed computing systems, the credit card verification system may be a second system that the first system communicates with. The second system may also have similar reliance on computer hardware, system storage, networking, power, cooling and such in order to operate. In some embodiments, the first system may not be able to complete a purchase without access to the second system and because of this, any time that the second system may fail, the first system may also fail. The connected failure between the two systems may occur even in the event that they do not share the same resources such as computer hardware, system storage, networking, power, cooling and such. In some embodiments, if there is only one instance of the second system, the first system may be very vulnerable to failures in the second system. Effective analysis of the system structure may help identify this vulnerability and may help to facilitate mitigating this vulnerability by, for example, providing multiple instances of the second system, thereby increasing reliability and reducing vulnerability of the first.

Techniques described and suggested herein include methods, systems and processes for creating and analyzing a representation of the computing system resources and computer system entities. In some embodiments, the system may be represented using a graph where resources and/or entities are represented as nodes of the graph and relationships are represented as edges of the graph. Relationships may include, but not be limited to, various system dependencies between the resources and/or entities, a flow of data between the resources and/or entities, supply chain links between the resources and/or entities and other such relationships. In some embodiments, the system may be represented by an equivalent structure such as a table, a matrix or set of matrices, one or more systems of equations, a tree or set of trees or these and/or a combination of such similar structures that show the relationships of entities and resources. The graph or equivalent structure may have one or more weighted relationships between the resources and/or entities that represent a variety of valuations of the importance of the relationship including, but not limited to, the importance of the existence of the relationship, the economic value of the relationship, the cost of failure of the relationship, or a combination of these and/or other relationship valuations. The presence of weightings on the relationships between the entities or resource may have an effect on the type of analysis and optimizations that may be performed because in some embodiments, those weightings may make some components more important to the analysis than others.

In some embodiments, the graph or equivalent structure may be created from actual data such as system documentation, system monitors, system callbacks and traces, instrumenting system hardware and software, or a combination of these and/or other such system data gathering techniques. The graph or equivalent structure may be based on an actual system, or on a proposed or planned system or on a partially or wholly theoretical system. The data to create and/or update the graph representation may be derived from known data or may be partially derived from known data and partially derived from theoretical, proposed, hypothetical or experimental data. In some embodiments where the data to create and/or update the graph is derived from an actual system, the graph may be updated based on observations of the actual system. For example, a graph may have a node which represents a certain entity and one or more edges connected to that node which represent dependencies between the certain entity and other entities. Observations of the actual system may provide data indicating that, for example, certain of the one or more edges may not represent real dependencies, or that certain dependencies may be missing or that certain dependencies may occur sometimes, but not always. These observations may be used to update the graph representation, bringing that representation more closely in line with the actual system. The process of creating a representation, observing the system and updating the representation based on the observations of the system may be iterated, at least partially improving the verisimilitude of the representation at each iteration.

Once created, the graph or equivalent structure may be analyzed to derive information about the structure of the computer system. In some embodiments, system vulnerabilities may be identified by locating single and/or critical resource dependencies. In some embodiments, extraneous, unused, redundant or otherwise unnecessary resources, entities and/or relationships between such resources or entities may be identified by finding isolated nodes in the graph or equivalent structure. In some embodiments, other aspects of the system may also be analyzed including, but not limited to, system creation or operational cost, network availability, power systems, cooling systems, hardware cost, hardware availability and/or other such system aspects. As may be contemplated, there are numerous methods that can be used to analyze the system and as also may be contemplated, the best methods for analysis may depend on the representation of the system chosen and the type and/or scope of information that is desired.

For example, in some embodiments, representations of the system may lend themselves to statistical and probability analysis to identify system vulnerabilities. In such systems, if the predicted failure rate of various components is known, the predicted failure of other components may be computed by repeated random sampling of the system, such as the repeated random sampling that occurs in, for example, a Monte Carlo simulation algorithm. In a Monte-Carlo simulation, repeated random perturbations of the system state are applied to a system and the success and/or failure of the system as a whole and/or various components is recorded. In the case of a computing system, operation resources and entities with a known failure rate may be simulated with a random number generator and the resulting failure of dependent components may then be computed. For example, a randomized simulated failure of a first computer system entity or resource may lead to a simulated failure of other computer system entities and/or resources that directly or indirectly depend on the first computer system entity or resource. Statistical analysis of the resulting numerical distributions of system resource and entity failures using regression analysis or some such similar method may lead to the identification of correlations between failures in one system and/or resource and failures in other systems and/or resources. Such correlations may identify potential vulnerabilities in the system. As may be contemplated, there are many other aspects of a computing system that may be analyzed using a graph or equivalent representation including, but not limited to, cost analyses of system structure changes, performance impact analyses of hardware and/or software upgrades and/or replacements, network throughput based at least in part on time of day, customer load, system access and/or other factors, potential impact of scheduled maintenance, system security vulnerabilities or a combination of these and/or other system aspects. As also may be contemplated, there are many other simulation and analysis methods that may be applied to create and analyze system data. The choice of the methods may depend on a variety of factors including, but not limited to, the size of the system, the data available, the analysis desired, the resources available, cost to compute, time-critical nature of the analysis or a combination of these and/or other simulation and analysis methods.

In addition to using techniques described herein to analyze a graph or equivalent structure representing a computing system, techniques described and suggested herein include methods, systems and processes for altering and/or modifying the graph or equivalent structure to potentially improve the system. In some embodiments, improving the system may include, for example, reducing system failure rates, decreasing system cost, increasing system throughput, reducing network bandwidth, reducing system redundancy, increasing system redundancy or a combination of these and/or other factors for system improvement. Factors for system improvement may be chosen based at least in part on the type of system, the nature of the analysis, the needs of system users or operators or a combination of these and/or other system improvement needs. As mentioned previously, the graph or equivalent structure may be based at least in part on an actual system, or on a proposed or planned system or on a partially or wholly theoretical system. Altering the representative graph or equivalent structure may provide suggestions for improving the corresponding actual system, or for improving the proposed, planned or theoretical system design. In some embodiments, the graph or equivalent structure may be altered in a response to the preceding analysis. In such embodiments, if the analysis were to identify a system vulnerability such as, for example, a first resource or entity that depends on a second resource or entity where that second resource or entity may be unique, the graph, and the corresponding system, might be altered to provide one or more additional redundant instances of that second resource or entity. This local optimization of one aspect of the graph or equivalent structure may be isolated or it may be repeated throughout different subsections of the system, providing one or more localized improvements to the system.

There are numerous methods and techniques that may be used to partially or fully optimize the graph or equivalent structure and thus, as may be contemplated, to improve the corresponding actual, proposed, planned or theoretical system. The method or technique chosen may depend on a variety of factors including the size of the system, the data available, the improvement desired or a combination of these and/or other such similar factors. In some embodiments, the graph or equivalent structure may be optimized using, for example, a metaheuristic optimization technique such as an evolutionary algorithm or a probabilistic optimization algorithm. For example, a genetic algorithm which allows mutations of the structure of the system and holds constant the weighting of the relationships may be used to improve the system structure. In another example, a simulated annealing algorithm which gradually decreases the probability of failure by altering the system state may also be used to improve the system structure. In such optimization implementations, system failures and/or higher likelihoods of system failures may be decreased while other system constraints such as, for example, keeping new hardware costs down, might be increased. Alterations to the graph or other representation may be tried and analyzed for improving the structure based at least in part on the constraints and selections. Alterations to the graph that improve the system and/or reduce the probability of failure in the system may be retained. Alteration to the graph that do not improve the system and/or do not reduce the probability of failure in the system may be discarded. Repeatedly altering and analyzing the system may provide a more optimal graph or equivalent structure representation of the system and thus, may provide improvements to the corresponding system. In some embodiments, other non-heuristic iterative methods with or without guaranteed or predicted global convergence may be used to optimize the graph or equivalent structure and thus optimize the corresponding system. Such iterative methods include, but are not limited to, Newton's and quasi-Newton methods, gradient descents, conjugate gradient methods and other such methods. Like the metaheuristic optimization techniques, the effectiveness and accuracy of the optimization may depend on the information stored in the graph or other representation, the weighting of the dependencies, the factors chosen for optimization or a combination of these and/or other factors.

Regardless of the method chosen for optimization, the graph or equivalent structure may be at least partially optimized and, in some embodiments, that optimized structure may be used to at least suggest improvements to the corresponding system, whether that system is an actual system or a proposed, planned or theoretical system. In some embodiments, optimizations and alterations of the system may include analyzing and optimizing to rid the system vulnerabilities. As mentioned above, in some embodiments, optimizations and alterations of the system may include analyzing and optimizing to reduce system failure rates, to lower system cost, to improve system throughput, to reduce network bandwidth, to reduce or increase redundancy or a combination of these and/or other factors for system improvement. In some embodiments, analysis of the system dependencies may be performed for the purposes of determining the effects of planned failures for such activities as system maintenance, system upgrades, scheduled outages or a combination of these and/or other anticipated reasons. In some embodiments, analysis of the system dependencies may be performed for the purposes of determining and analyzing the effects of unplanned failures in order to, for example, locate and mitigate system vulnerabilities. As may be contemplated, analysis and optimization using a graph or equivalent representation of a system may not be limited to applications involving computer systems. In an illustrative example, consider a supply chain wherein supplies for manufacturing may come from a variety of sources. If the supply chain can be represented by a graph or equivalent structure as described herein, analysis of that graph may reveal certain supply chain vulnerabilities including, for example, having only a single source for a critical component. Identification of the vulnerability may be the first step in taking steps to mitigate the vulnerability. Just as in the analysis and optimization of the computer system, the availability of better and more accurate data regarding potential failures of the system may provide valuable information about those vulnerabilities and may provide potential suggestions on how to address and/or mitigate those vulnerabilities.

FIG. 1 illustrates an example environment 100 wherein resources, entities and connections and/or dependencies between resources and entities on distributed and/or virtualized computing systems may be represented, analyzed and/or optimized in accordance with at least one embodiment. A key resource 102 may be dependent on a resource 104 and a second resource 108. Resource 104 may be dependent on resource 106 which may be dependent on resource 110. Resource 108 may be dependent on resource 112. Before any changes are made to the structure of a system, the system may be vulnerable to several failures. As may be contemplated, if any of the resources 104, 106, 108, 110 or 112 fail, key resource 102 also may fail. For example, a failure in resource 110 leads to a failure in resource 106, which leads to a failure in resource 104, which leads to a failure in key resource 102. Changes may be made to the structure of the system including, but not limited to, adding extra resources, making those extra resources redundant, migrating resources from being dependent on one resource to being redundant on a different resource and other such alterations and/or modifications. After changes are made to the structure of the system, the system may be much less vulnerable to resource failures. In order to increase the stability of the system and to increase the availability of key resource 102, two new resources are added. Resource 114 may be a redundant copy of resource 106 and resource 116 may be a redundant copy of resource 108. In some embodiments, making resource 104 multiply dependent on resources 106 and 114 increases the availability of resource 104, since it may only fail if both resource 106 and 114 fail at the same time. Similarly, making key resource 102 multiply dependent on resources 108 and 116 increases the availability of key resource 102, since it may only fail if resource 104, resource 108 and resource 116 all fail at the same time. To further increase stability and availability, resource 106 may be migrated to depend on resource 112 while the new resources 114 and 116 may depend on resource 110. Under the altered system structure, key resource 102 may be available in all cases except in those cases where certain combinations of multiple resources fail at the same time. No individual failure except the failure of resource 104 may cause key resource 102 to fail. As may be contemplated, adding at least one redundant copy of resource 104 may eliminate this remaining vulnerability. As may be contemplated, the analysis of the graph representation may provide valuable information that may lead to a reduction of computing system vulnerabilities.

Figure 2:
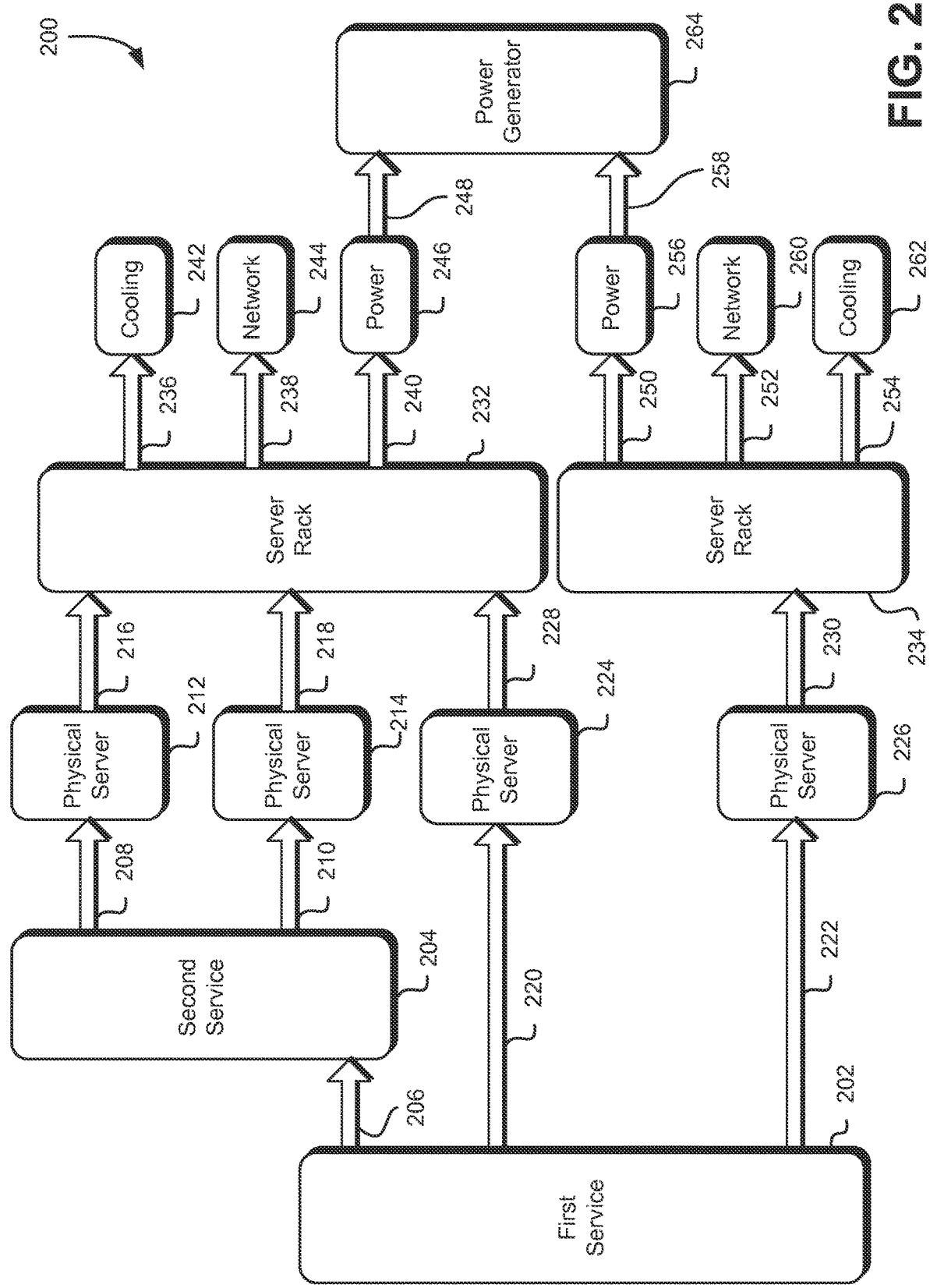
FIG. 2 illustrates an example environment in which entities and the dependencies between those entities in distributed and/or virtualized computer systems may be represented and/or analyzed in accordance with at least one embodiment.

FIG. 2 illustrates an example environment 200 wherein resources, entities and connections and/or dependencies between resources and entities on distributed and/or virtualized computing systems may be represented, analyzed and/or optimized in accordance FIG. 1 and in accordance with at least one embodiment. A first service 202, which may be one of a plurality of services on a computing system, may be running on physical server 224, which may be installed on server rack 232. The first service may also be running on physical server 226, which may be installed on server rack 234. The first service may be running an instance on each of the two servers so as to provide redundant functionality to clients and/or users that may request or require functionality provided by the first services. In some embodiments, a service such as the first service may be running on only one physical server, with no redundant functionality. In such embodiments, the service may be dependent on the physical server for its operation. In some embodiments, a service such as the first service may be running on a plurality of physical servers, with multiply redundant functionality. In such embodiments, the service may be dependent on each of the plurality of physical servers for its operation, or may be partially dependent on each of the plurality of physical servers. In some embodiments, a service such as the first service may be dependent only on a certain minimum number of one or more of the plurality of physical servers for its operation.

In FIG. 2 a dependency relationship 220 may exist between first service 202 and physical server 224. A dependency between a first entity or resource and a second entity or resource may indicate that if the second entity or resource is less than fully functional, the first entity or resource may also be less than fully functional. In some embodiments, if the second entity or resource is less than fully functional, the first entity or resource may not function at all, or the first entity or resource may partially function or the first entity or resource may not be impacted by the loss of functionality in the second entity or resource. In some embodiments, if the second entity or resource is not at all functional, the first entity or resource may not function at all, or the first entity or resource may partially function or the first entity or resource may not be impacted by the loss of functionality in the second entity or resource. In dependencies where a loss of functionality in the second resource or entity may cause a complete loss of functionality in the first resource or entity, the first resource or entity may be completely, fully or singularly dependent on the second resource or entity. In dependencies where there is not a complete, full or singular dependency, the first resource or entity may be said to be partially dependent on the second resource or entity. Where there is no dependency between two entities or resources, the two entities or resources may be said to be independent. As may be contemplated the relationship between an entity or resource such as a service and an entity or resource such as a server that may be represented in a graph or other equivalent representation may be a relationship other than a dependency relationship such as a network connectedness relationship, or an economic relationship, or a resource chain relationship, or a combination of these and/or other relationships.

As may be contemplated, one or more partial dependencies may together create a complete dependency. For example, in FIG. 2, first service 202 may have a partial dependency 220 on physical server 224. The dependency 220 may be a partial dependency if the first service may still function if physical server 224 is non-functional. Similarly, first service 202 may have a second partial dependency 222 on physical server 226 wherein the first service may also still function if physical server 226 is non-functional. The two partial dependencies 220 and 222 may be said to be redundant as may the two physical servers 224 and 226 since the first service may still function if either of the two servers fails. However, if in the example illustrated in FIG. 2, both servers 224 and 226 were to fail at the same time, first service 202 may not function. In such embodiments, first service 202 may be said to be completely or fully dependent on physical servers 224 and 226 together even though the first service may be only partially dependent on either of them individually. In some embodiments, the dependency 228 between physical server 224 and server rack 232 may be said to be a complete dependency if, as may be contemplated, the failure of server rack 232 may necessarily lead to the failure of physical server 224. Similarly, the dependency 230 between physical server 226 and server rack 234 may be said to be a complete dependency. Server rack 234 may be 250 fully dependent on power 256 since it is unlikely that the server rack may function without power and power 256 may be 258 fully dependent on power generator 264 for the same reason.

In some embodiments, whether a dependency between resources and/or entities is full or partial may depend at least in part on the needs and/or requirements of upstream resources or entities. A second resource or entity is said to be upstream from a first resource or entity if either the second resource or entity partially and/or fully depends on the first resource or entity or the second resource or entity is upstream from a resource or entity that partially and/or fully depends on the first resource or entity. A second resource or entity is said to be downstream from a first resource or entity if either the first resource or entity partially and/or fully depends on the second resource or entity or the first resource or entity is downstream from a resource or entity that partially and/or fully depends on the second resource or entity. For example, in FIG. 2, server rack 234 is downstream from first service 202 and physical server 226 is upstream from power generator 264 while physical server 224 is neither downstream nor upstream from server rack 234. As mentioned previously, whether a dependency between resources and/or entities is full or partial may depend at least in part on the needs and/or requirements of upstream resources or entities. For example, server rack 234 may only be 252 partially dependent on network 260 if the server rack may provide at least some of its functionality to its client physical servers without network 260. If, in some embodiments, first service 202 may rarely or never require access to an external network in order to function, then server rack 234 may be able to function without access to network 260, and dependency 252 may be a partial dependency. Conversely, if first service 202 may not function at all without access to network 260, then dependency 252 may be a full dependency.

Whether a dependency may be full or partial may also depend, in some embodiments, on changing and/or changed conditions including, but not limited to, changes in upstream resource requirements, access to upstream resources or entities by certain other resources or entities, internal factors, external factors or a combination of these and/or other conditions. In some embodiments, first service 202 may only occasionally require access to the network 260. In such embodiments, when the first service does not require the network, the 252 dependency may be considered to be a partial dependency and at those times when the first service does require the network, the 252 dependency may be considered to be a full dependency. Similarly, in some embodiments, server rack 234 may, for example, function without cooling 262 for one minute in the summer months, for five minutes in the fall and spring months and indefinitely in the winter months. In such embodiments, the combination of an external factor, the time of year, and an internal factor, the length of time the cooling system has been non-functional, may determine whether the dependency 254 is a partial or a full dependency.

In the example environment 200 illustrated in FIG. 2, the dependency 206 between first service 202 and second service 204 may be either a full or a partial dependency. Dependencies between entities of this sort may include, for example, a dependency between a retail purchase service and a credit card processing service, or a dependency between a login portal service and a user authentication service or other such service dependencies. In some embodiments, the first service may not function without the second service and the dependency 206 may be a full dependency wherein full or partial failures of the second service may cause at least partial failures in the first service. In some embodiments, the first service may be able to function without the second service and the dependency 206 may be a partial dependency. As may be contemplated and as mentioned herein, in some embodiments, whether the dependency is full or partial may depend on changing conditions in the system.

As mentioned above, first service 202 may 220 partially depend on physical server 224 and may partially depend 222 on physical server 226 and may fully depend on the combination of servers 224 and 226. Similarly, second service 204 partially depend 208 on physical server 212 and may partially depend 210 on physical server 214 and may fully depend on the combination of servers 212 and 214. In some embodiments, such as is illustrated in FIG. 2, physical server 212 may be fully dependent 216 on server rack 232 and physical server 214 may also be fully dependent 218 on server rack 232. In such embodiments, second service 204 may be fully dependent on server rack 232 because a failure of server rack 232 may cause failures of both physical servers 212 and 214, meaning that the all of the servers that second service 204 depends on may have failed. In such embodiments, second server 204 may be said to be fully dependent on server rack 232 and also on any resource or entity that server rack 232 is dependent on. So for example, server rack 232 may be fully dependent on power 246 and that may be fully dependent on power generator 264 and so second service 204 may also be fully dependent on those entities. Similarly, under certain conditions and/or requirements as described herein, server rack 132 may be, at times fully dependent on cooling 242 and/or network 244 and so second service 204 may also, at times and/or under certain conditions and/or requirements, be fully dependent on one or both of those two entities. In the remainder of FIG. 2, the dependencies of server rack 232 are similar to the dependencies of server rack 234 described above. The dependency 240 of server rack 232 on power 246 and the dependency 248 of power 246 on power generator 264 may be full dependencies since, as may be contemplated, the server most likely may not function without power. The dependency 236 of server rack 232 on cooling 242 may be full or partial as described herein as may the dependency 238 on network 244.

As may be contemplated, the relationships between the resources and/or entities described in connection herein and at least in connection with FIG. 2 may be any sort of relationship between two resources or entities. The description herein uses dependencies as an example relationship between resources and/or entities but use of dependencies is not intended to limit the scope of relationships that can be modeled, analyzed and/or optimized nor is the use of computer system resources or entities intended to limit the scope of the objects that can be related. Other relationships and other types of objects are considered to be within the scope of this disclosure. In some embodiments, the resources or entities may be considered to be computing system resources as described herein, but the relationships between them, rather than being dependencies may be, for example, network connectivity, or the flow of certain types of data, or supply chain requirements, or different type of geographical connections or other such relationships. In some embodiments the resources and/or entities may not be computer system resources or entities and may instead considered to be, for example, suppliers of components, events in a workflow or other such relatable objects. In such embodiments the relationships between the objects may be physical supply chains, or dependency steps or other relationships as would make sense depending on the objects and system being modeled.

Figure 3:
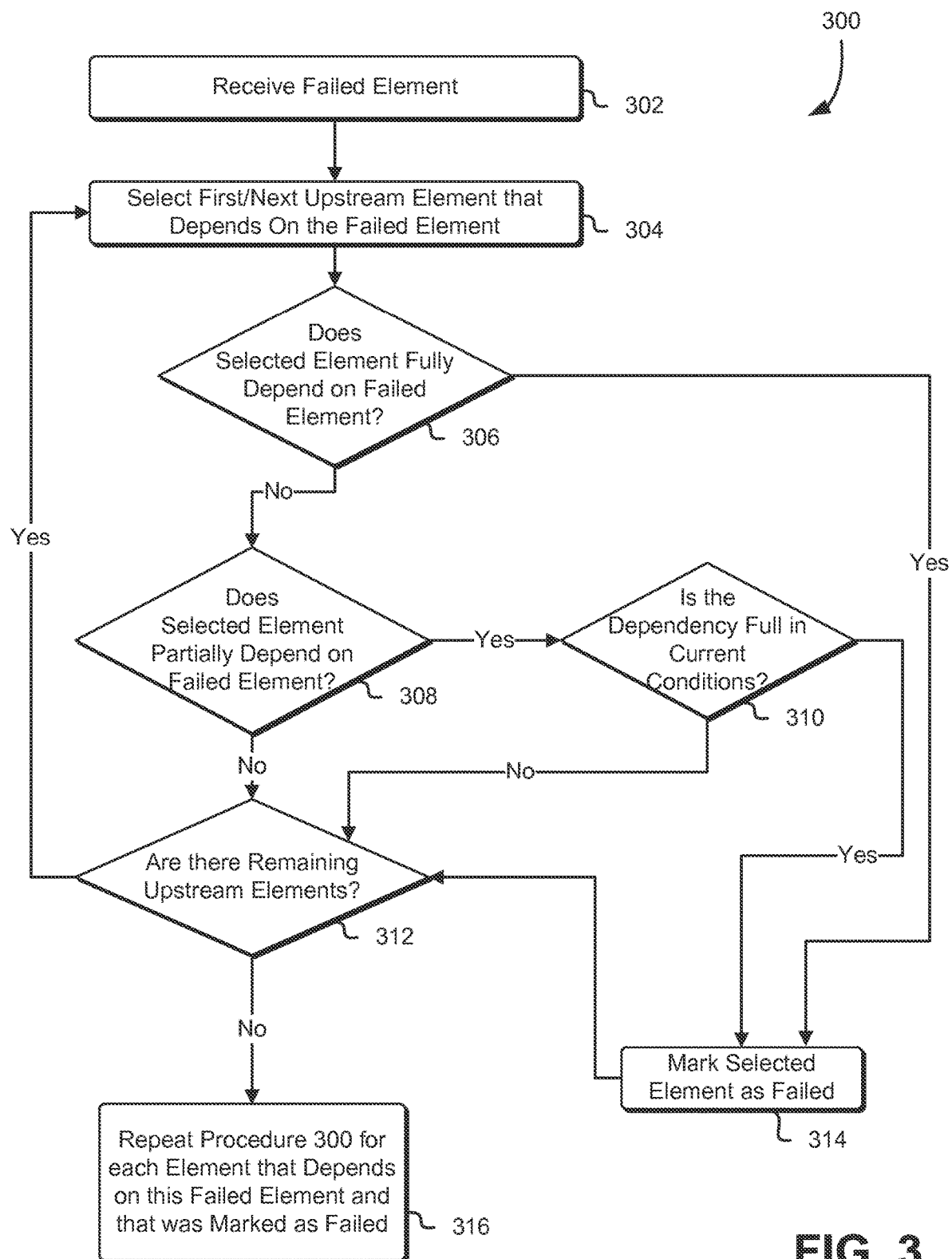
FIG. 3 illustrates an example process for identifying failed resources or elements in a distributed and/or virtualized computing system in accordance with at least one embodiment.

FIG. 3 illustrates an example process 300 for identifying failed resources or elements in a distributed or virtual computing system based at least in part on their dependency or dependencies with other failed resources or elements in the computing system in accordance with at least one embodiment. In some embodiments, an element that has failed is received 302. The element may be selected from a list of one or more failed elements according to a specified order, or according to system need, or according to economic and/or other value or according to a combination of these and/or other criteria. Once received, the first upstream element 304 that depends on the failed element may be selected. This first upstream element may be selected from the set of those elements that are immediately upstream of the selected failed element and may be selected from the set of those upstream elements according to a specified order, or according to system need, or according to economic and/or other value or according to a combination of these and/or other criteria.

Once an upstream element is selected, it may be determined 306 if the selected upstream element fully depends on the failed element from step 302. If the selected upstream element does fully depend on the failed element, then 314 the selected upstream element may be marked as failed. If the selected upstream element does not fully depend on the failed element, it may be determined 308 if the selected upstream element at least partially depends on the failed element. If the selected upstream element at least partially depends on the failed element, then it may be determined 310 if the selected upstream element may fully depend on the failed element in the current and/or future system. The determination of whether the selected upstream element may fully depend on the failed element in the current and/or future system may, in some embodiments, at least be partially based at least in part on examining the current and/or future needs of the upstream element or may, in some requirements, at least be partially based at least in part on examining the current and/or future needs of elements upstream from the upstream element or may, in some embodiments, at least be partially based at least in part on examining and/or analyzing other elements or resources in the computing system or may, in some embodiments, at least be partially based at least in part on one or more internal and/or external factors or may, in some embodiments, at least be partially based at least in part on a combination of these and/or other factors. If the selected upstream element does at least partially depend on the failed element and if the selected upstream element may fully depend on the failed element in the current and/or future system, then 314 the selected upstream element may be marked as failed. Regardless of whether the selected upstream element was marked as failed or not, it may be then determined 312 whether there are any remaining immediately upstream elements.

If there are any remaining immediately upstream elements, the next element 304 is selected from the list of immediately upstream elements and process 300 iterates on that element. The next upstream element selected may be selected from the set of those upstream elements according to a specified order, or according to system need, or according to economic and/or other value or according to a combination of these and/or other criteria. Once all upstream elements are processed and possibly marked as failed, the process 300 may repeat 316, starting with any of the upstream elements that may have been marked as failed in the previous iteration. As may be contemplated, in some embodiments, process 300 may be implemented in a recursive fashion, where when an element is 314 marked as failed, process 300 begins at process step 302 with that element, returning from that recursion to step 312. In some embodiments, process 300 may be performed on a subsection of the graph or other representation, according to system, analytic and/or other factors.

Figure 4:
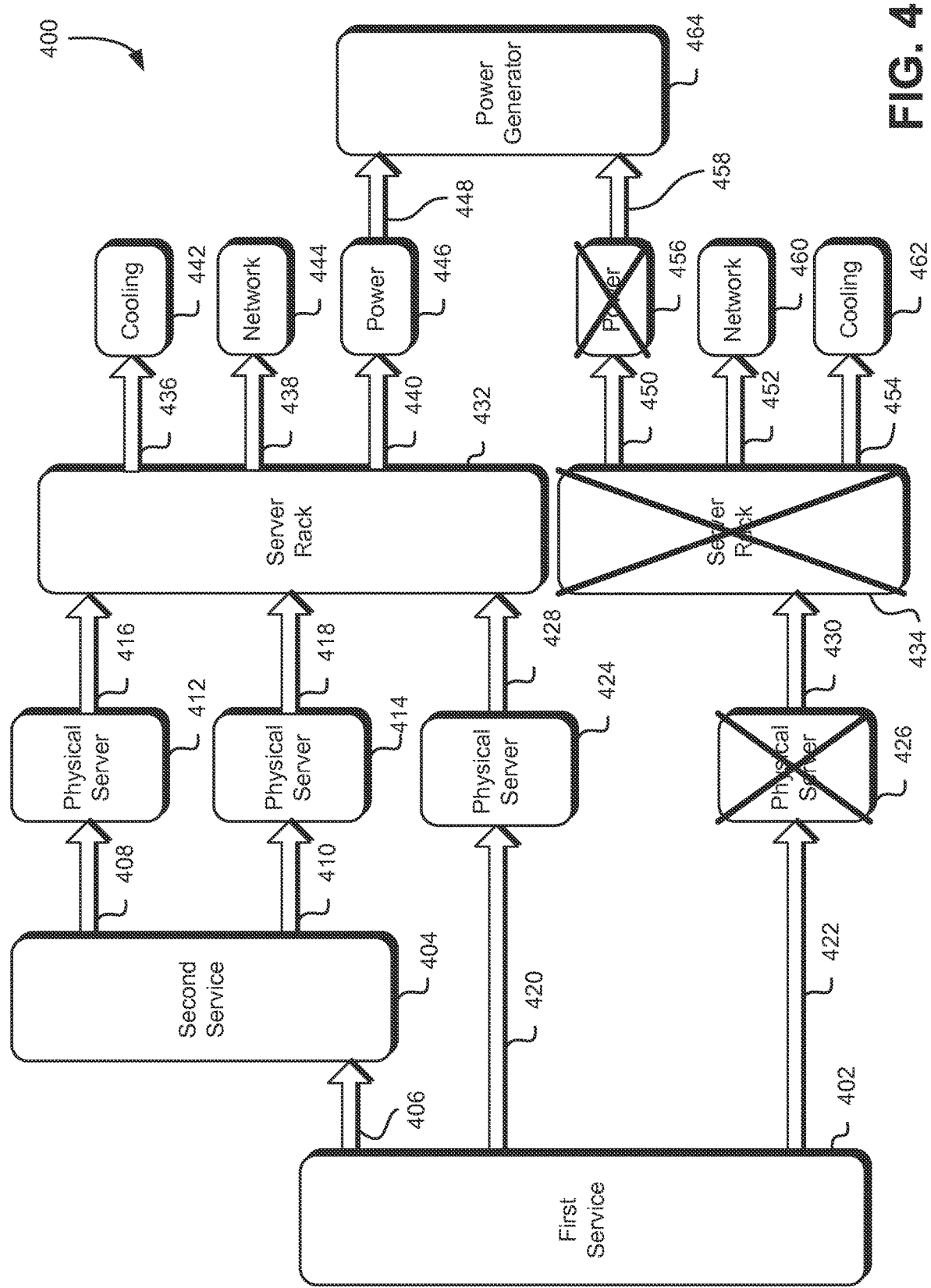
FIG. 4 illustrates an example environment in which the process from FIG. 3 may be applied to an example distributed and/or virtualized computing system in accordance with at least one embodiment.

FIG. 4 illustrates an example environment 400 showing how process 300 may be performed on an example system in accordance with at least one embodiment. In FIG. 4, power unit 456 may be selected for failure. Power unit 456 may be selected for failure because it may require maintenance and must be shut down, or because it may have actually failed on an implemented system, or because the impact of such failure may require analysis on an implemented system, or because a proposed system may require analysis for such failures or for a combination of these and/or other such reasons. In applying process 300 with power unit 456 as the failed element, only server rack 434 is upstream from the power unit. In some embodiments, assuming dependency 450 is a full dependency as described at least in connection with FIG. 2, server rack 434 may also be marked for failure. Performing process 300 on server rack 434 and again assuming that dependency 430 is a full dependency, physical server 426 may also be marked for failure.

In some embodiments, due to the failure of physical server 426, if dependency 420 is a full dependency then first service 402 may be marked as failed. If dependency 422 is not a full dependency, first service 402 may be partially dependent on physical server 426 and so may in some embodiments be marked for failure. Whether or not first service 402 may be marked for failure may depend on the system itself and the needs of first service 402 as described at least in connection with FIG. 2. Whether the first service fully depends on the physical server 426 may depend on the nature of the first service's dependence 420 on physical server 424. In some embodiments, if physical server 424 were to fail at the same time as physical server 426, first service 402 may be marked as failure. In examining the downstream elements of physical server 424, FIG. 4 illustrates a full dependency 428 on server rack 432 which has an at least partial dependency 436 on cooling 442, an at least partial dependency 438 on network 444 and a full dependency 440 on power unit 446. Power unit 446 has a full dependency 448 on power generator 464, which has no downstream elements.

In the system illustrated in FIG. 4, it is unlikely that physical server 424 may be marked for failure due to the failure of power unit 456 because no elements upstream of power unit 456 are downstream from physical server 424. By a similar analysis, it is unlikely that any of power generator 464 which is downstream from power unit 456 via full dependency 458, network 460 which is downstream from server rack 452 via dependency 452 which is at least a partial dependency and cooling 462 which is downstream from server rack 452 via dependency 454 which is at least a partial dependency may be marked for failure due to the failure of power unit 456 in the system illustrated in FIG. 4. As it is unlikely that server rack 432 may be marked for failure, it is equally unlikely that either physical server 412, which has a full dependency 416 on server rack 432 or physical server 414, which has a full dependency 418 on server rack 432, may be marked for failure. It is also unlikely that second service 404, with an at least partial dependency 408 on physical server 412 and an at least partial dependency 410 on physical server 414 may be marked for failure and thus, first service 402 with an at least partial dependency 406 on second service 404 is unlikely to marked for failure under the application of process 300 to the system illustrated in FIG. 4.

Figure 5:
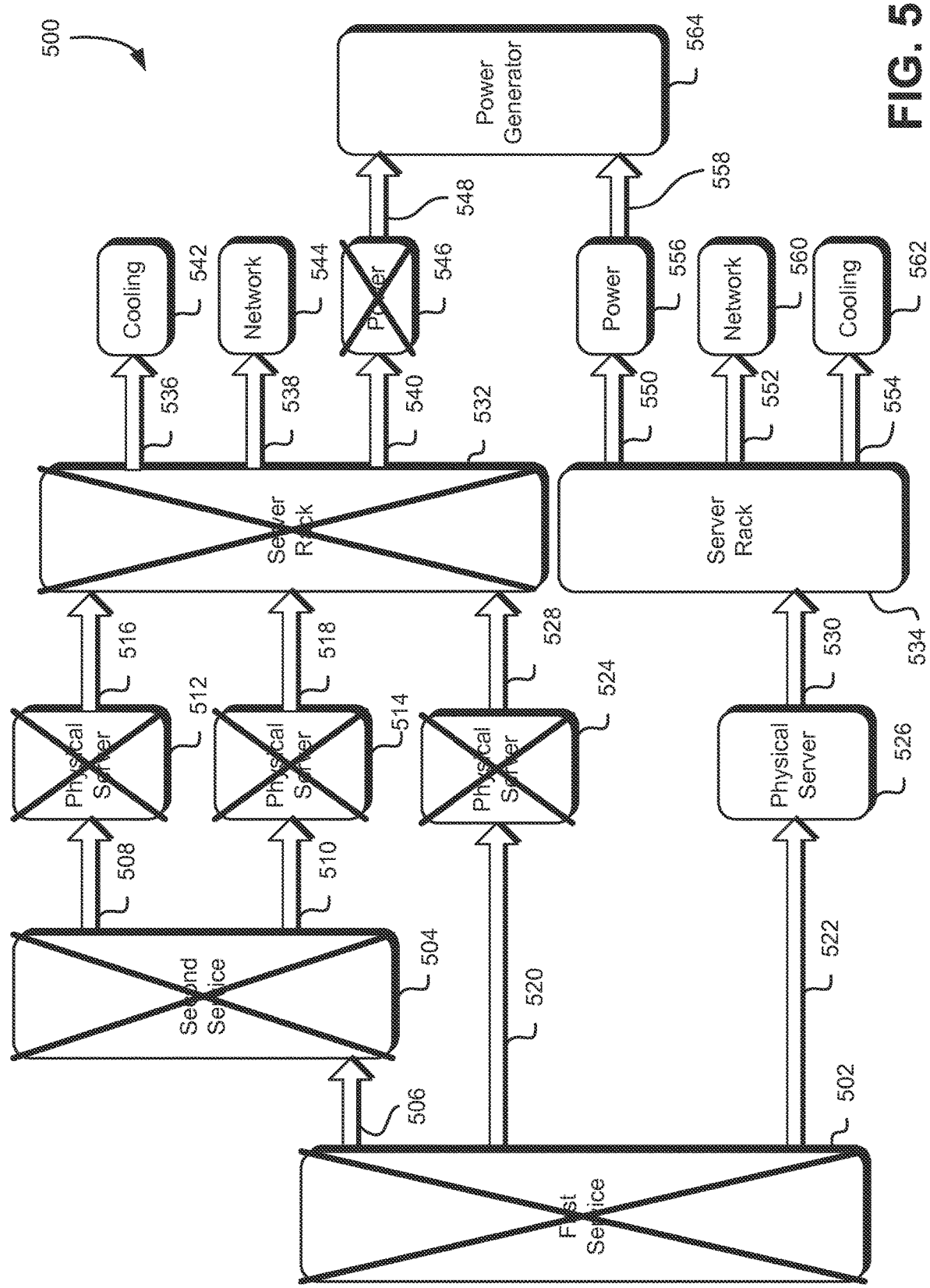
FIG. 5 illustrates another example environment in which the process from FIG. 3 may be applied to an example distributed and/or virtualized computing system in accordance with at least one embodiment.

FIG. 5 illustrates an example environment 500 showing how process 300 may be performed on an example system in accordance with at least one embodiment. In some embodiments, power unit 546 may be selected for failure. Server rack 532, with full dependency 540 on power unit 546 may also be marked for failure, leading to failures in physical servers 512, 514 and 516 with full dependencies 516, 518 and 528 respectively. As described previously at least in connection with at least FIG. 2, second service 504, with at least partial dependency 508 on failed physical server 512 and at least partial dependency 510 on failed physical server 514 may also be marked for failure as it without any functioning servers to run on. In the system illustrated in FIG. 5, first service 502 has at least a partial dependency 520 on failed physical server 524 and so analysis of the nature of the dependency 520 and of the system might be needed to determine a potential failure. Since first service 502 may have a full dependency 506 on second service 504, the first service may also be marked for failure and the analysis of physical server 524 may not be necessary. First service 502 still may have an available server 526 via an at least partial dependency 522, which by its downstream dependency 530 on server rack 534, and because server rack 534 is dependent 550 on power 556, dependent 552 on network 560 and dependent 554 on cooling 562, server rack 534 may still be running. The operational status of server rack 534 may be irrelevant in this system because first service 502 has already failed. Both the failed power unit 546 and the running power unit 556 are dependent on power generator 564 via dependencies 548 and 558 respectively and, as may be contemplated, failure of power generator 564 would cause a failure in the entire system illustrated in FIG. 5.

Figure 6:
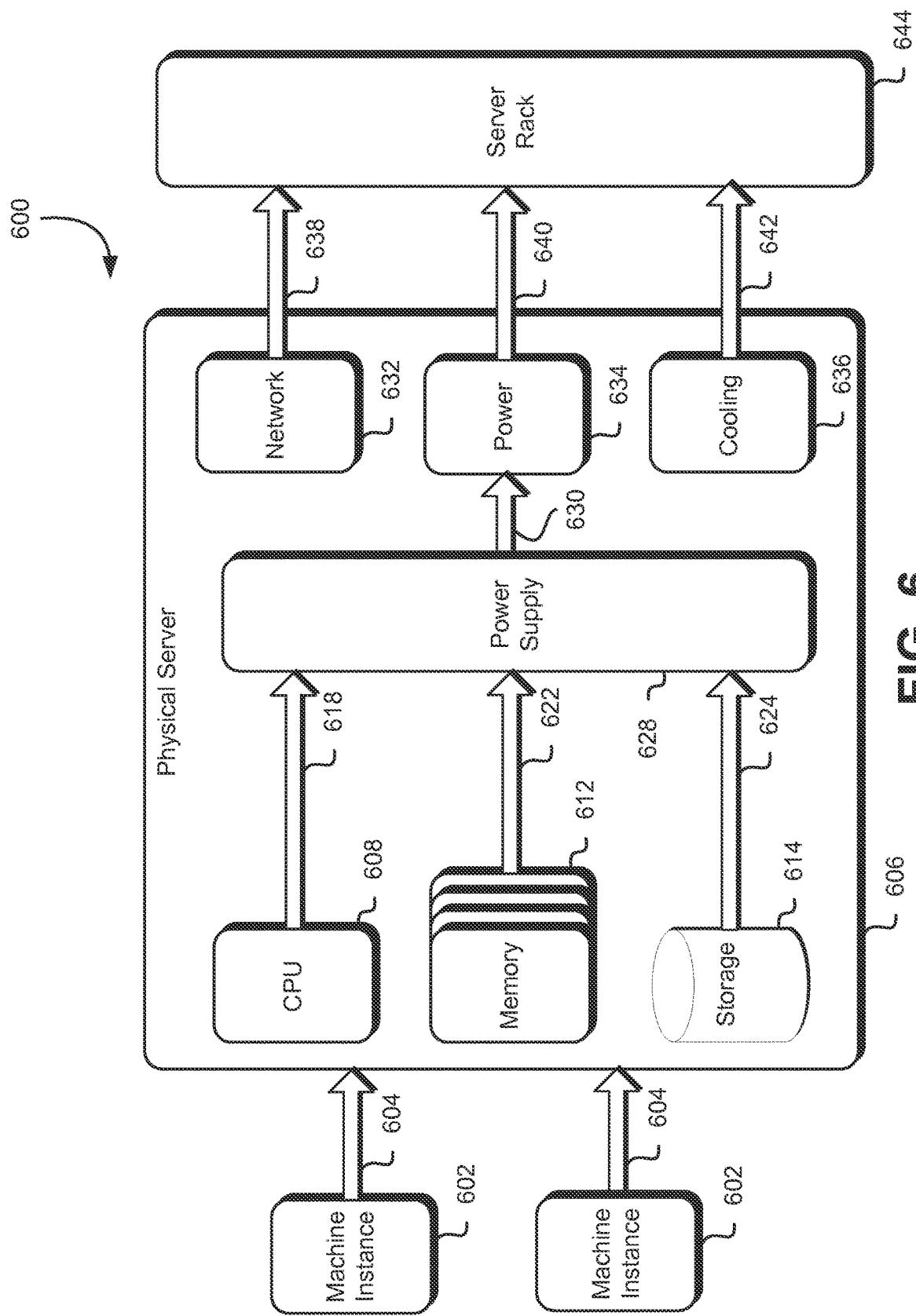
FIG. 6 illustrates an example environment in which entities within a physical server and dependencies between those entities may be represented and/or analyzed in accordance with at least one embodiment.

FIG. 6 illustrates an example environment 600 wherein internal resources, entities and connections and/or dependencies between resources and entities in a physical server operating on distributed and/or virtualized computing systems may be represented, analyzed and/or optimized at least in connection with FIG. 1 and in accordance with at least one embodiment. One or more machine instances 602 may be connected to a physical server 606 via a dependency 602. In some embodiments, a dependency 602 may be a full dependency insomuch as a machine instance may not operate without a physical server. In some embodiments, a dependency 602 may be a partial dependency if a machine instance may be migrated to another physical server as described at least in connection with FIG. 2 and in accordance with at least one embodiment. Physical server 602 may contain one or more CPUs 608, one or more memory units 612 and one or more storage units 614. In some embodiments the CPU, memory and storage units may be integrated as a single device or may be combinations of one or more separate devices. In some embodiments, the memory and storage may be the same and/or substantially similar devices and may share and/or substantially share the same components. The memory may be a single unit or may be a plurality of units and may be referred to herein both collectively and as individual units as the memory. As may be contemplated, the CPU 608 may be at least partially dependent 618 on a power supply 628. In some embodiments, this may be a full dependency since, as may be contemplated, the CPU probably may not operate without power. The memory 612 and the storage 614 may also have at least partial dependencies 622 and 624, respectively, on the power supply 628. In some embodiments, the CPU, the memory and/or the storage may have other dependencies not illustrated in FIG. 6 including, but not limited to, dependencies on each other, dependencies on other components not illustrated here, dependencies on external components or a combination of these and/or other dependencies. Power supply 628 in FIG. 6 may be at least partially dependent 630 on power 634 and, because it is unlikely the power supply may not function without power, this may be a full dependency. Physical server 606 may have dependencies on server rack 644 as illustrated at least in connection with FIGS. 1 and 2 and in accordance with at least one embodiment. As may be contemplated, a network connection 632 on physical server 606 may at least partially depend 638 on server rack 644 for an incoming network connection. Cooling 636 on physical server 606 may also at least partially depend 642 on cooling infrastructure from server rack 644. Power unit 634 on physical server 606 may at least partially depend 642 on incoming power from server rack 644.

As described herein, and as may be contemplated, process 300 illustrated at least in connection with FIG. 3 and in accordance with at least one embodiment may be applied to components of an entity or resource as well as to components of a system of entities or resource. For example, if server rack 644 were to fail, physical server 606 is likely to fail as well, including, but not limited to failures in power 634, power supply 628, CPU 608, memory 612 and storage 614 as well as failures of machine instances 602. In some embodiments, and as illustrated in FIG. 6, failure of most elements of physical server 606 may be likely to lead to failures of both machine instances 602. Physical server 606 may be able, in some embodiments and in some conditions, be able to function with the loss of the network 632 and/or the cooling 636 as described at least in connection with FIGS. 1 and 2, and because it may be considered redundant, may also be able to function with the loss of at least some portion of memory 612. Nonetheless, analysis of FIG. 6 according to process 300 described at least in connection with FIG. 3 reveals that this example environment with its lack of redundancy may be considered vulnerable, especially to failure in, for example, CPU 608 or storage 614.

Figure 7:
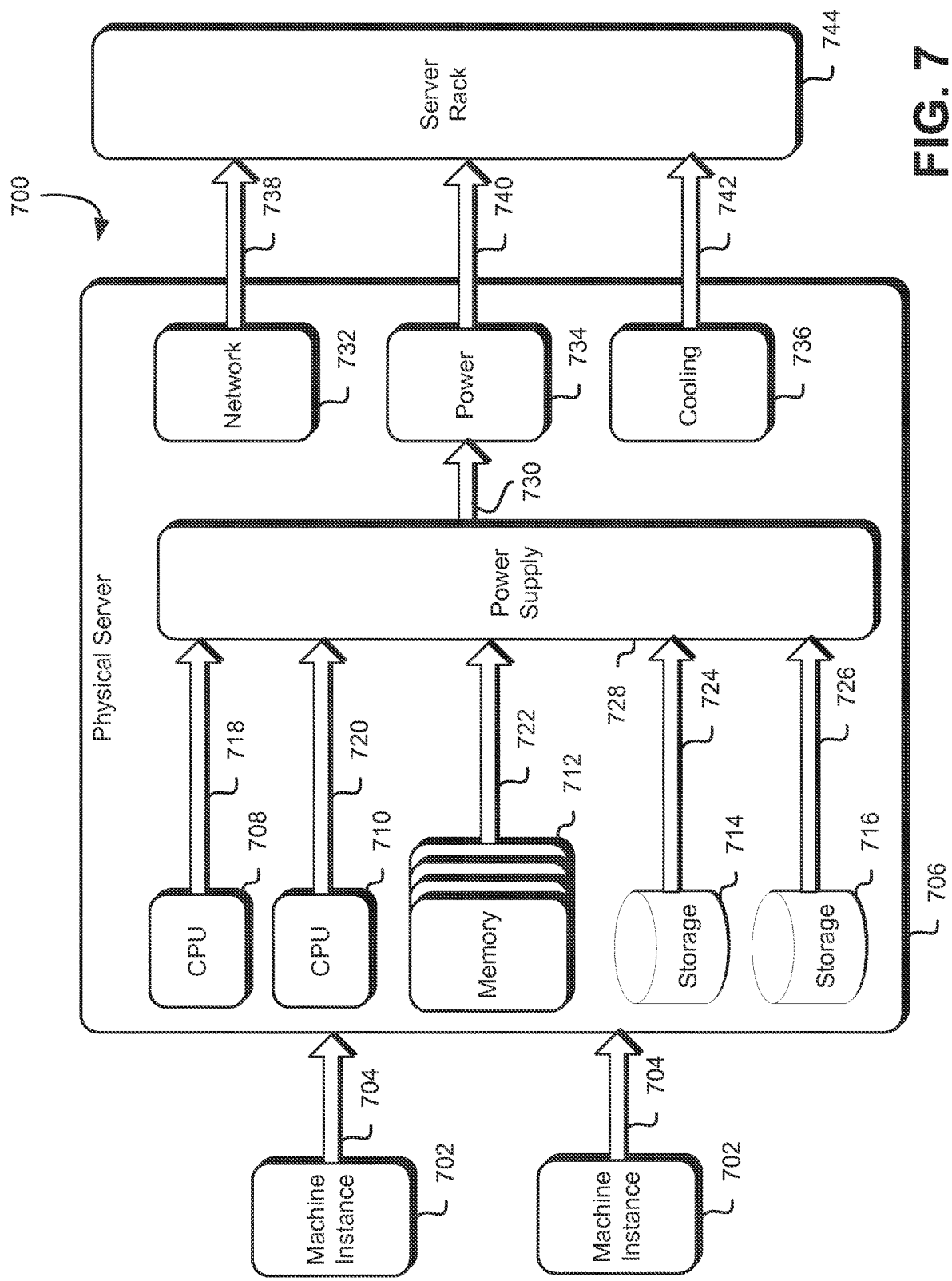
FIG. 7 illustrates an example environment in which entities within a physical server and dependencies between those entities may be represented and/or optimized in accordance with at least one embodiment.

FIG. 7 illustrates an example environment 700 wherein internal resources, entities and connections and/or dependencies between resources and entities in a physical server operating on distributed and/or virtualized computing systems may be represented, analyzed and/or optimized at least in connection with FIG. 1 and in accordance with at least one embodiment. FIG. 7 is similar to the example environment illustrated in FIG. 6, but with additional redundant components added to mitigate some of the vulnerabilities of the environment illustrated in FIG. 6. Physical server 706 may have at least one additional CPU 710, making for a plurality of CPUs, 708 and 710, and may have at least one additional storage element 716, making for a plurality of storage 714 and 716. In some embodiments, machine instances 702, dependent 704 on physical server 706 may still be vulnerable to failures in power supply 728 since a failure in power supply 728 may cause failures in, both CPUs 708 and 710 with their dependencies 718 and 720 respectively, memory 712 with its dependency 722 and storage 714 and 716 with their dependencies 724 and 726 respectively. As described herein, at least in connection with FIG. 6 and in accordance with at least one embodiment, power supply 728 may be at least partially dependent 730 on power 734 which itself may be at least partially dependent 740 on server rack 744. As may be contemplated, a network connection 732 on physical server 706 may at least partially depend 738 on server rack 744 for an incoming network connection. Cooling 736 on physical server 706 may also at least partially depend 742 on cooling infrastructure from server rack 744. As described at least in connection with FIG. 6, physical server 706 may be able, in some embodiments and in some conditions, be able to function with the loss of the network 732 and/or the cooling 736. Because it may be considered redundant, physical server 706 may also be able to function with the loss of at least some portion of memory 712 and also because they are now redundant, may be able function with a loss of some of the plurality of CPUs and a loss of some of the plurality of storage locations.

Figure 8:
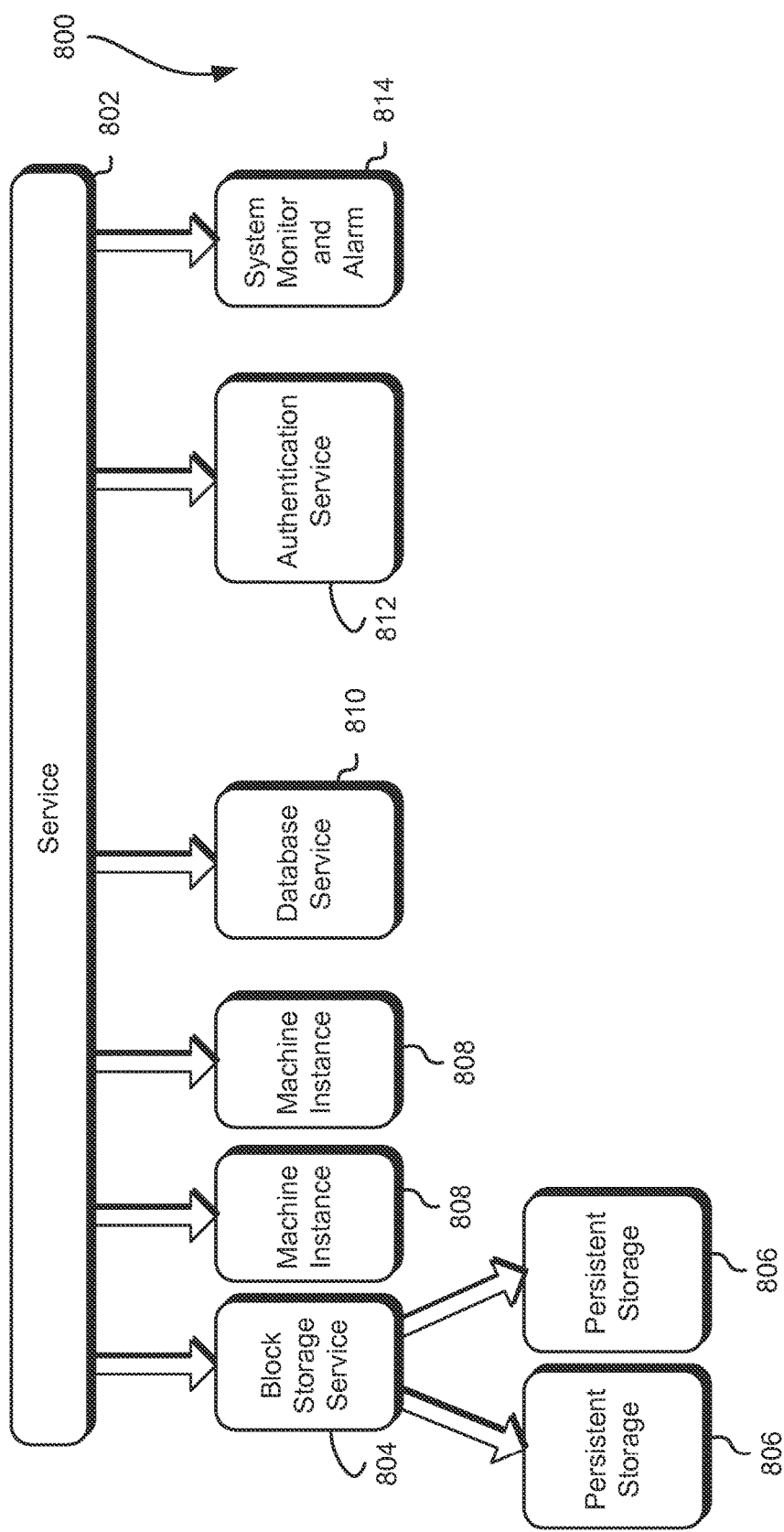
FIG. 8 illustrates an example environment in which entities within a computer service and dependencies between those entities may be represented, analyzed and/or optimized in accordance with at least one embodiment.

FIG. 8 illustrates an example environment 800 wherein resources, entities and connections and/or dependencies between resources and entities in a service operating on distributed and/or virtualized computing systems may be represented, analyzed and/or optimized at least in connection with FIG. 1 and in accordance with at least one embodiment. In some embodiments, a service 802 may be dependent on one or more resources or entities. The resources and entities on which a service at least partially depends may themselves each be at least partially dependent on one or more resources or entities as may those resources and entities be at least partially dependent on one or more resources and entities and so on. The dependencies may be at least partial dependencies and, in some embodiments, the dependencies may be full dependencies as described herein at least in connection with FIGS. 1 and 2 and in accordance with at least one embodiment. In the example environment 800 illustrated in FIG. 8, a service 802 may be at least partially dependent on a block storage service 804. In some embodiments, when the block storage service may not be redundant and/or in certain system configurations and/or situations, the dependency may be a full dependency as described at least in connection with FIGS. 1 and 2. The block storage service 804 may be at least partially dependent on one or more persistent storage locations 806. In some embodiments, service 802 may also be at least partially dependent on one or more machine instances 808, a database service 810, an authentication service 812 and/or a system monitor and alarm 814. As may be contemplated, each of these resources or entities may also be at least partially dependent other resources or entities which are not illustrated in example environment 800.

Figure 9:
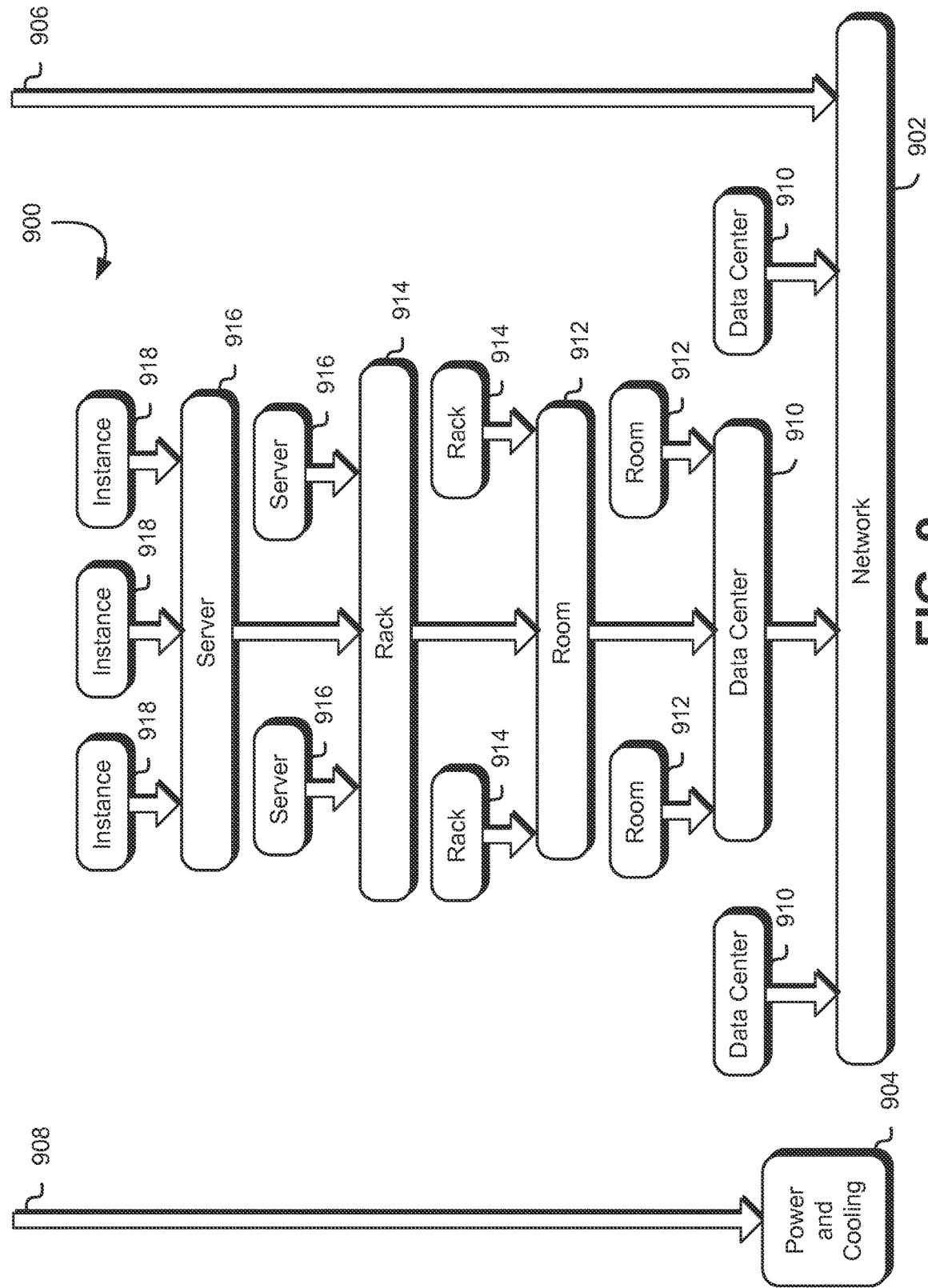
FIG. 9 illustrates an example environment in which entities within a hierarchical collection of entities in a distributed and/or virtualized computing system may be represented, analyzed and/or optimized in accordance with at least one embodiment.

FIG. 9 illustrates an example environment 900 wherein resources, entities and connections and/or dependencies between resources and entities in a hierarchical collection of resources and entities operating on distributed and/or virtualized computing systems may be represented, analyzed and/or optimized at least in connection with FIG. 1 and in accordance with at least one embodiment. As may be contemplated, in such a hierarchical system, the resources and entities at some or all levels of the hierarchy may, in some embodiments, be at least partially dependent 906 on network 902 and may also be at least partially dependent 908 on power and/or cooling 904. In some embodiments the network, power and/or cooling may be distributed from a single source or may be distributed through redundant sources or may be distributed through a combination of single source and redundant sources. In some embodiments, one or more instances 918 may be at least partially dependent on a server 916 as described at least in connection with FIGS. 1 and 2. In some embodiments and as described at least in connection with FIGS. 1 and 2, unless the instances may migrate between servers, the dependency of an instance on a server may be a full dependency. In some embodiments, one or more servers 916 may be at least partially dependent on a rack 914, one or more racks 914 may be at least partially dependent on a room 912, and one or more rooms may be dependent on a data center 910. One or more data centers may be connected by a network 902 and may also, in some embodiments, be at least partially dependent on that network.

Figure 10:
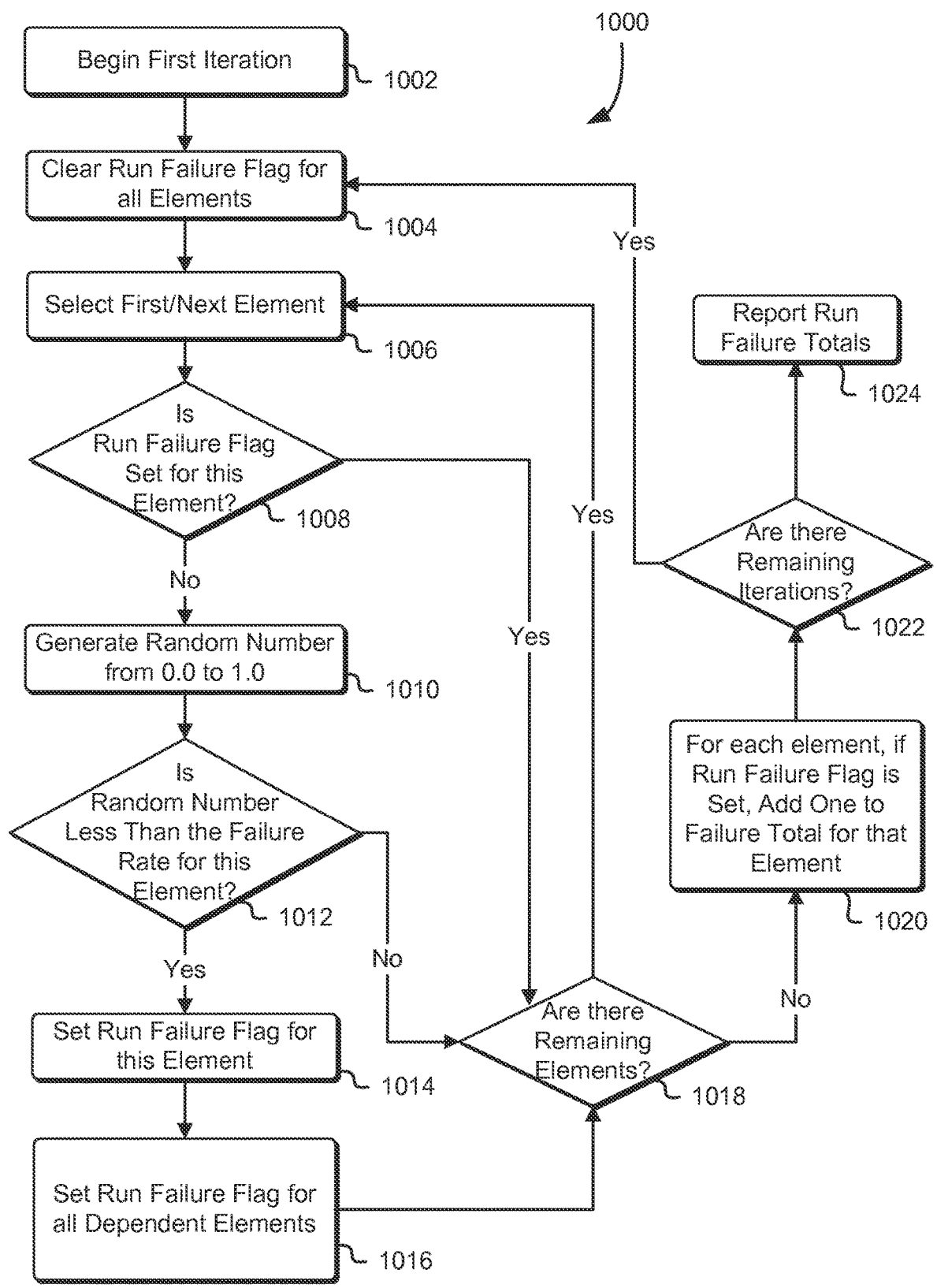
FIG. 10 illustrates an example process for simulating and computing the probability of failed resources or elements in a distributed or virtual computing system in accordance with at least one embodiment.

FIG. 10 illustrates an example process 1000 for simulating and computing the probability of failed resources or elements in a distributed or virtual computing system based at least in part on their dependency with other failed resources or elements in the computing system in accordance with at least one embodiment. The process illustrated in FIG. 10 may be performed one or more times. In some embodiments, the quality and reliability of the data may increase as more iterations of the process are performed. In some embodiments 1002 the data gathering process may be initialized by performing operations including, but not limited to, reserving memory for data storage, initializing a random number generator, setting initial values of variables or a combination of these and/or other initialization procedures. Then, 1004 resources or elements that meet selection criteria that may make them relevant for the current analysis may be selected and a run failure flag may be cleared for those one or more resources or elements in the computing system that may meet selection criteria. The resources or elements that may be selected based at least in part on a number of criteria based at least in part on factors such as, but not limited to, system importance, economic or other value, system architecture or a combination of these and/or other such criteria. Next 1006 the first resource or element from the computing system may be selected for processing. The element may be selected from a list of one or more elements relevant to the analysis in the system according to a specified order, or according to system need, or according to economic and/or other value or according to a combination of these and/or other criteria. The list of elements that may be selected for step 1006 may be the same as the list selected for step 1004 or it may be a different list. If 1008 the run failure flag was already set for this resource element and for this iteration, it may not be necessary to perform any further analysis on this element for this iteration and in that event, it may be determined 1018 if there are any remaining elements to process.

In the event that the run failure flag was not already set in this iteration for this element, 1010 a random number between, for example, 0.0 and 1.0 inclusive may be generated that may represent a probability that this element has failed. In some embodiments, the random number may be generated by any of a number of available random number generation techniques including, but not limited to, a pseudorandom number generator, or the selection of an element from a set of random numbers, or a separate stochastically random process or a combination of these and/or other random number generation techniques. The random number generated may represent a chance that the selected element has or has not failed, and is compared 1012 against the failure rate of the selected element. In some embodiments, the failure rate of an element is based at least in part on a known failure rate that may have been supplied by a manufacturer or may have been calculated from observations or may have been observed from data or may have been calculated by applying a process like and/or similar to process 1000 to the element or may have been calculated by a combination of these and/or other techniques for determining a failure rate. In some embodiments, the failure rate of an element may not be known and may only be estimated. If the random number generated in step 1010 is less than the failure rate of the element, then the element has failed for this iteration. For example, if an element has a one percent failure rate and the random number generator generates a number less than 0.01, the element may be marked as having suffered a simulated failure for this iteration by 1014 setting the run failure flag for this element and for this iteration.

If the run failure flag is set for this element and for this iteration then the process may also 1016 set the run failure flag for those upstream elements that depend on the selected element using a process like process 300 described herein at least in connection with FIG. 3. In some embodiments, it may be necessary to evaluate elements of the system and/or external element in order to determine whether upstream elements may be marked as failed for this iteration. Once processing has completed for the selected elements, 1018 it may be determined if there are any remaining elements that may be processed for this iteration. If there are, the next element in the system is selected. The next element may be selected from a list of one or more remaining elements relevant to the analysis in the system according to a specified order, or according to system need, or according to economic and/or other value or according to a combination of these and/or other criteria. If there are no more remaining elements for this iteration, the resources or elements in the system may be examined and a total number of failures for each element that has had its run failure flag set may be incremented 1020. The run failure flag may have been set for this iteration either because the element had a simulated random failure or because the element failed because a dependent downstream element failed. In some embodiments, the different types of failures may be treated and accumulated by different methods. In some embodiments, the different types of failures may be treated and accumulated by the same methods. In some embodiments, a combination of these techniques may be used. If 1022 there are more iterations that may be performed, the run flag of each of the resources or elements may be cleared 1004 before beginning the next iteration. If there are no more iterations that may be performed, the total failures for each iteration 1024 may be reported.

Figure 11:
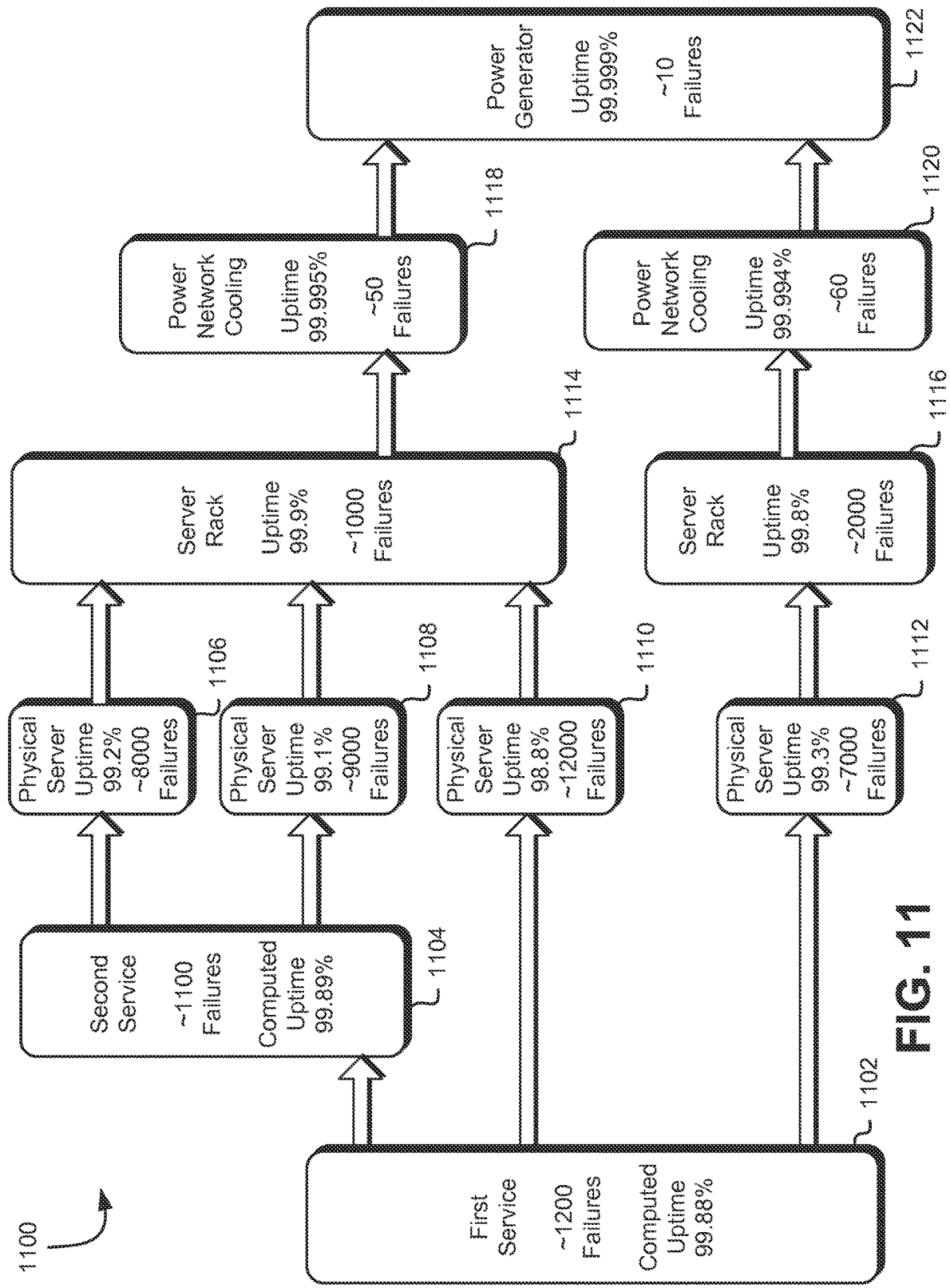
FIG. 11 illustrates an example environment in which the process from FIG. 10 may be applied to an example distributed and/or virtualized computing system in accordance with at least one embodiment.

FIG. 11 illustrates an example environment 1100 wherein the process 1000 illustrated in FIG. 10 may be applied to a system as described at least in connection with FIGS. 1 and 2 and in accordance with at least one environment. As may be contemplated, with an iterative random number simulation such as the process described at least in connection with FIG. 10, better and/or more reliable statistical results may be obtained by increasing the number of iterations. FIG. 11 shows the results of applying an algorithm such as that described at least in connection with FIG. 10 at least one million times. Starting from the furthest downstream element, in one million iterations, power generator 1122 with an uptime of 99.999% may be expected to have approximately ten failures. Power, network and cooling unit 1118 with an uptime of 99.995% may be expected to have approximately fifty failures. Since power, network and cooling unit 1118 may be partially dependent on power generator 1122, the fifty failures in unit 1118 may include ten failures as a result of power generator 1122 failing. Power, network and cooling unit 1120 with an uptime of 99.994% may be expected to have approximately sixty failures. Moving upstream, server racks 1114 and 1116 may have increasing numbers of failures as may be contemplated and physical servers 1106, 1108, 1110 and 1112 may have a corresponding even greater number of failures. In some embodiments, second service 1104 and first service 1102 may have a smaller number of failures because of their redundant dependencies on their physical servers. For example, second service 1104 may only fail when physical server 1106 and physical server 1108 both fail. The number of failures for second server 1104 is higher than the number of failures of server rack 1114 because, by the numbers shown in the example, physical server 1106 and physical server 1108 fail more often than the server rack fails.

Figure 12:
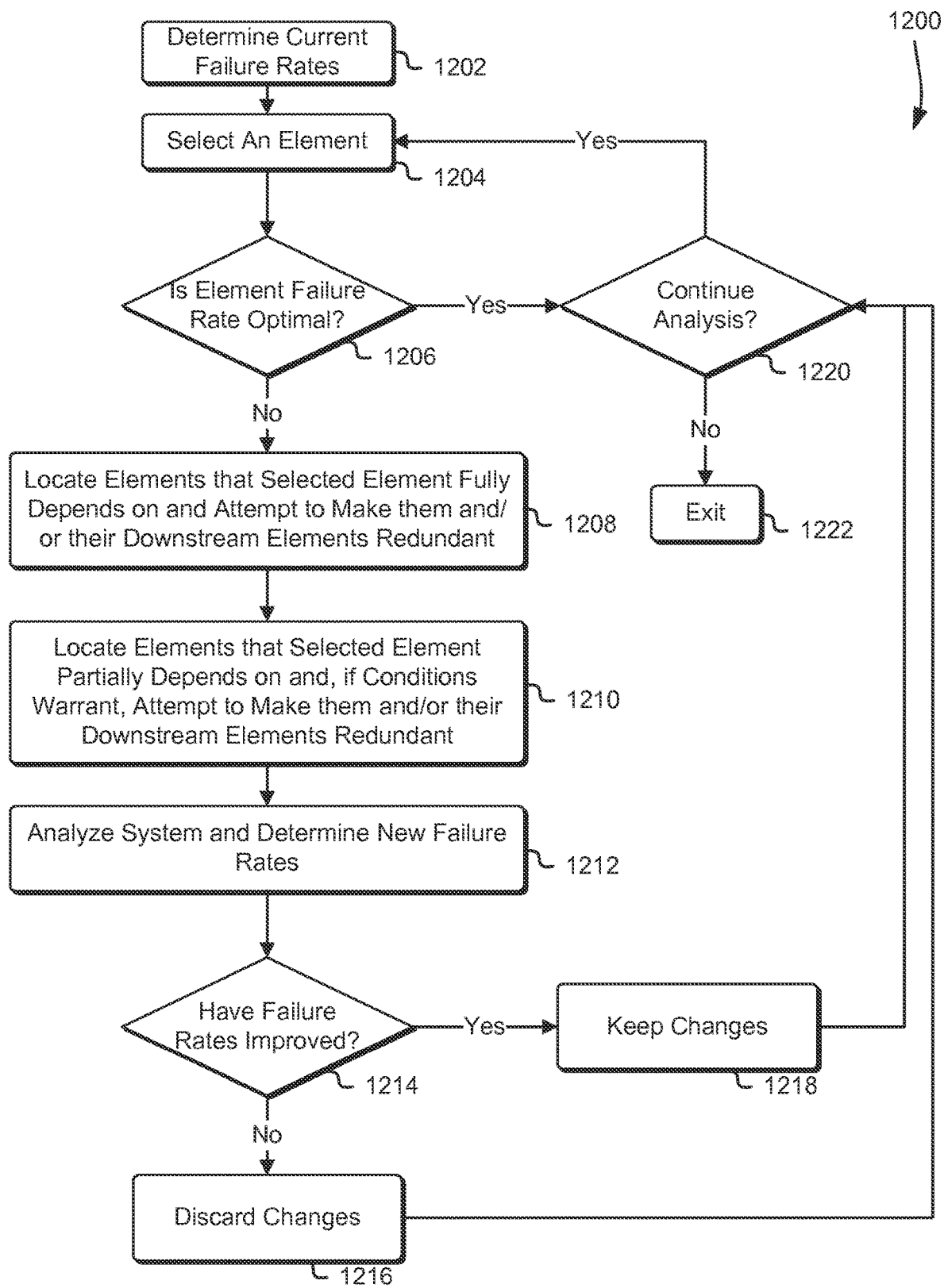
FIG. 12 illustrates an example process for modifying the representation of a distributed and/or virtualized computing system in accordance with at least one embodiment.

FIG. 12 illustrates an example process 1200 for modifying the graph or equivalent representation of the resources or elements and/or the relationship between those resources or elements in a distributed or virtual computing system as described herein and in accordance with at least one embodiment. First 1202 current failure rates may be determined for the resources and entities in the computing system. The current failure rates for the resources and entities in the computing system may be determined by estimating those rates, or may be determined from known or predicted failure rates of some or all of the resources or entities, or may be calculated from past, current and/or predicted data, or may be determined by running a simulation process such as the one described herein at least in connection with FIGS. 10 and 11 or may be determined from a combination of these and/or other such determination methods. Next 1204, an element may be selected. In some embodiments, the element may be selected according to system needs, or according economic or other value, or according to some algorithm, or according to random chance or according to a combination of these and/or other selection criteria. If, 1206 the element failure rate is already at least nearly optimal, then if 1220 analysis is to continue, 1204 another element may be selected. If 1220 analysis is not to continue, then 1222 the process may exit.

In some embodiments, elements may continue to be selected and evaluated until the process is interrupted. In some embodiments, elements may be preselected according to a number of different criteria and only those elements may be analyzed by process 1200. Whether 1206 the element failure rate of the selected element is already optimal may be determined by evaluating the current failure rate against a predicted, known, calculated and/or estimated failure rate for the element or resource. If it is determined that the failure rate is not optimal, the representation of the computing system may be altered by 1208 examining those elements that are downstream from the selected element and that the selected element may fully depend on. For those downstream elements that the selected element may be fully dependent on, an attempt may be made to reduce and/or eliminate that dependency by migrating dependencies to different resources and/or by adding or moving resources. Additionally, if it is determined that the failure rate is not optimal, the representation of the computing system may be altered by 1210 examining those elements that are downstream from the selected element and that the selected element may partially depend on and may fully depend on under the current system conditions. For those downstream elements that the selected element may partially depend on and may fully depend on under the current system conditions, an attempt may be made to reduce and/or eliminate that dependency by migrating dependencies to different resources and/or by adding or moving resources. The determination of whether the selected element may fully dependent or partially dependent and fully dependent under the current system conditions may be made by a process similar to the process 300 described herein at least in connection with FIG. 3 and in accordance with at least one embodiment.

After the representation of the computing system has had one or more alterations performed on it, the system representation is analyzed 1212 to determine the new failure rates for the elements and resources in the system. The system may be analyzed using a process similar to the process 300 described herein at least in connection with FIG. 3, or the system may be analyzed using a process similar to the process 1000 described herein at least in connection with FIG. 10 or the system may be analyzed by a combination of these and/or other similar processes. If, after the analysis of step 1212, it is determined 1214 that the failure rates of the system have improved as a result of the changes in steps 1208 and 1210, then the changes to the system may be retained 1218 and 1220 it may be determined if analysis is to continue. If it is determined 1214 that the failure rates have not improved, then the changes to the system may be discarded 1216 and again, 1220 it may be determined if analysis is to continue. Process 1200 may be run on the system one or more times, as system needs and/or other considerations may determine and each run of the process may include multiple iterations.

Figure 13:
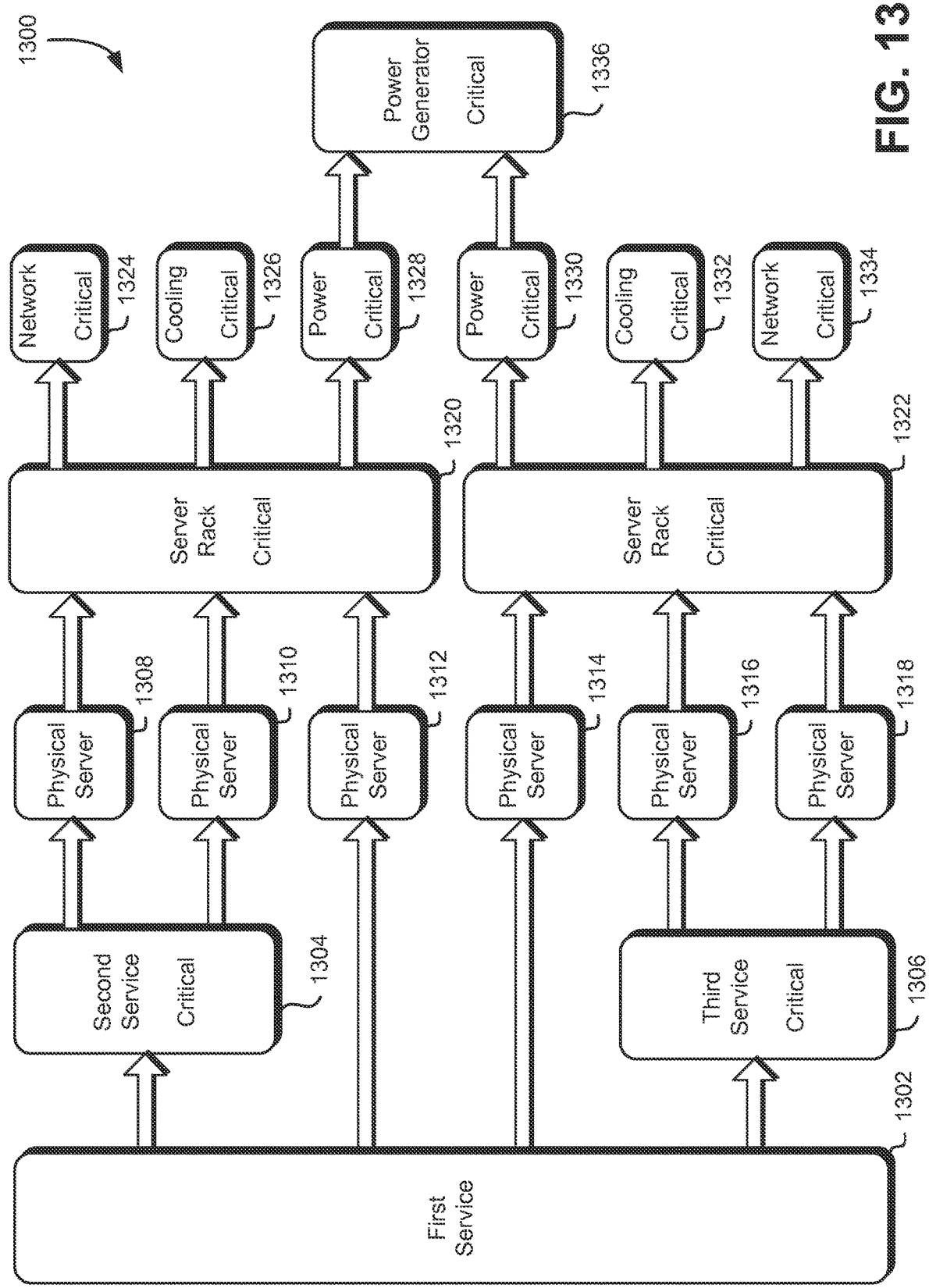
FIG. 13 illustrates an example environment in which the process from FIG. 12 may be applied to an example distributed and/or virtualized computing system in accordance with at least one embodiment.

FIG. 13 illustrates an example environment 1300 wherein the process 1200 illustrated in FIG. 12 may be applied to a system as described at least in connection with FIGS. 1 and 2 and in accordance with at least one environment. In FIG. 13, those resources or entities that may be critical to the continued operation and/or functionality of first service 1302 are marked as critical. An entity or resource may be considered critical if, according to analyses described herein at least in connection with FIGS. 1 and 2, failure of the entity or resource may lead directly or indirectly to the failure of the first service. As described herein and at least in connection with FIGS. 1 and 2, both second service 1304 and third service 1306 may be marked as critical if, in some embodiments, first service 1302 may not function without them. Examples of services that may be considered critical include, but are not limited to, a purchasing service that may depend on a credit card processing service, or a login service that may depend on a user database service, or a primary storage service that may depend on a backup secondary storage service and/or other such systems.

In FIG. 13 and as described herein at least in connection with FIGS. 1 and 2, first service 1302 may be partially dependent on physical server 1312 and partially dependent on physical server 1314 due to their being redundant, but fully dependent on at least one of them remaining operational. As such, neither of physical servers 1312 or 1314 is marked as critical, but the combination may be marked as critical for the purposes of this analysis. In some embodiments, first service 1302 may be fully dependent on one or both of physical servers 1312 and 1314 due to resource demands, bandwidth demands, user demand, system demand or a combination of these and/or other internal and/or external requirements. In the example illustrated here, it is assumed that first service 1302 is partially dependent on physical servers 1312 and 1314 and fully dependent on at least one of the two physical servers remaining operational. Other dependencies between a service and the physical servers that that service operates on, including, but no limited to, different numbers of servers, different types of dependencies and the like may be considered to be within the scope of this disclosure. Second service 1304 may also be partially dependent on physical server 1308 and partially dependent on physical server 1310 due to their being redundant, but fully dependent on at least one of them remaining operational. As such, neither of physical servers 1308 or 1310 is marked as critical, but the combination may be marked as critical for the purposes of this analysis. Similarly, third service 1306 may be partially dependent on physical server 1316 and partially dependent on physical server 1318 due to their being redundant, but fully dependent on at least one of them remaining operational. As such, neither of physical servers 1316 or 1318 is marked as critical, but the combination may be marked as critical for the purposes of this analysis.

As mentioned herein, different numbers of servers and different types of dependencies may be considered to be within the scope of this disclosure. The remaining resources and elements in the representation of the computing system may all be considered critical in the example illustrated in FIG. 13. As may be contemplated, the failure of server rack 1320 may lead to the failure of the three physical servers 1308, 1310 and 1312 on the server rack and thus to the failure of the second service, making server rack 1320 critical. The failure of server rack 1322 may lead to the failure of the three physical servers 1314, 1316 and 1318 and thus to failure of the third service, making server rack 1322 critical. Similarly, as mentioned herein, the failure of network 1324, cooling 1326 or power 1328 may lead to the failure of server rack 1320 while the failure of network 1334, cooling 1332 or power 1330 may lead to the failure of server rack 1322, making each of these elements critical. Finally, power generator 1336 may be considered critical because power 1328 and power 1330 may be dependent on power generator 1336. As illustrated, the computing system represented in FIG. 13 has many elements that may be marked as critical and thus, according to the analysis, the computing system may be very vulnerable to failure.

Figure 14:
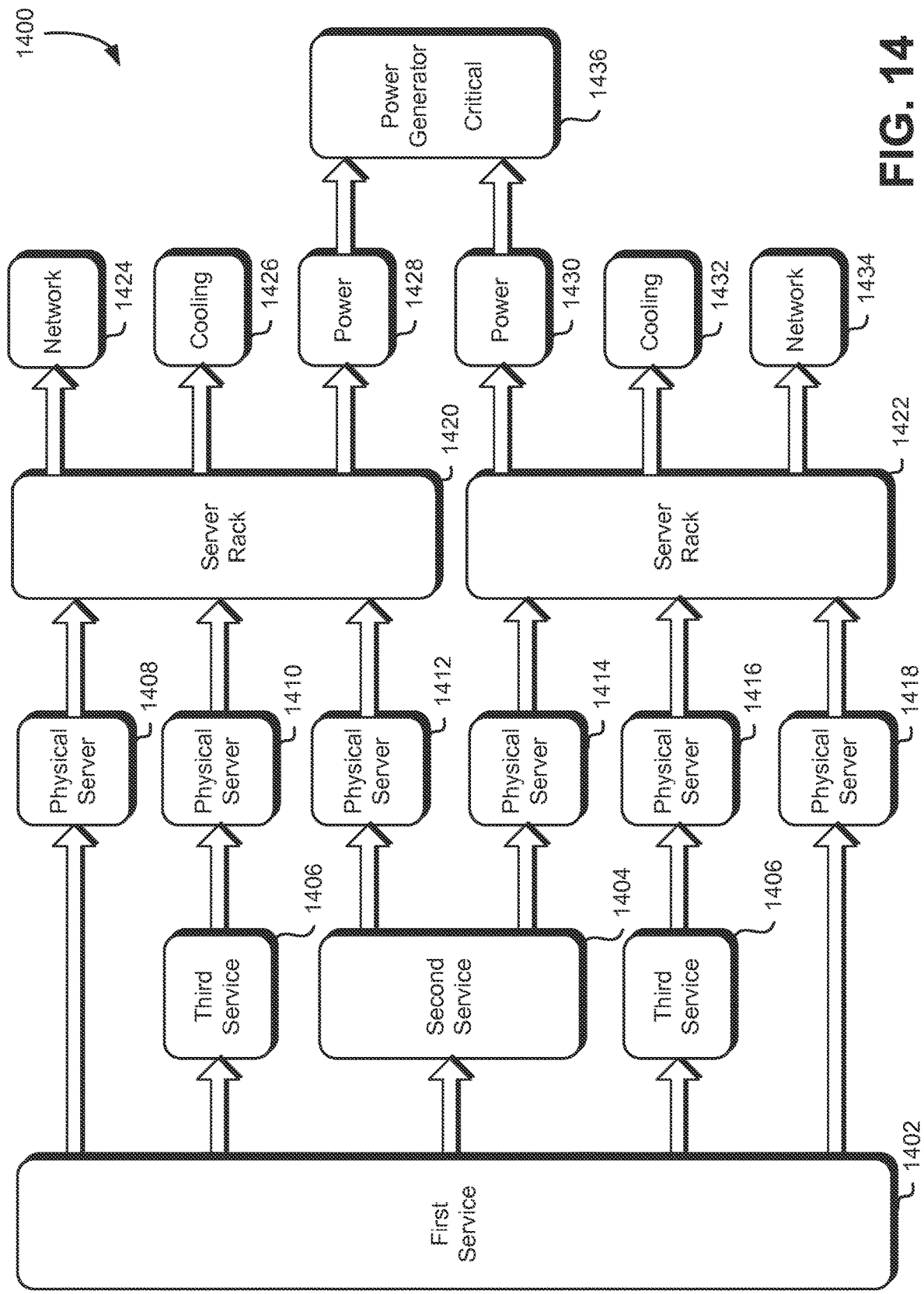
FIG. 14 illustrates an example environment in which the process from FIG. 12 may have been applied to the example distributed and/or virtualized computing system illustrated in FIG. 13, in accordance with at least one embodiment.

FIG. 14 illustrates an example environment 1400 showing a result of applying the process 1200 illustrated in FIG. 12 to the example system illustrated in example environment 1300 in FIG. 13 as described at least in connection with FIGS. 1 and 2 and in accordance with at least one environment. In FIG. 14, those resources or entities that may remain critical to the continued operation of first service 1402 after the application of process 1200 are marked as critical. As illustrated in FIG. 13, both the second service and the third service were each running on physical servers running on one server rack which, in some embodiments, made those services critically dependent on those server racks. In FIG. 14, the second service 1404 has been migrated so that it is running on physical servers 1412 and 1414 running on two different server racks 1420 and 1422, which may make the second service partially dependent on each of the two server racks but fully dependent on neither of them. The third service 1406 has also been migrated so that it is running on physical servers 1410 and 1416 running on the two different server racks 1420 and 1422, which may make the third service partially dependent on each of the two server racks but fully dependent on neither of them. First service 1402 was, and still is, running on physical servers 1408 and 1418 running on the two different server racks 1420 and 1422, which also may make the first service partially dependent on each of the two server racks but fully dependent on neither of them. If server rack 1420 is not a critical dependency then network 1424, cooling 1426 and/or power 1428 also may also, in some embodiments, not be critical dependencies. If server rack 1422 is not a critical dependency then network 1434, cooling 1432 and/or power 1430 may also, in some embodiments, not be critical dependencies. Power generator 1436 may be a critical dependency because, if power generator 1436 fails then all power units, server racks, physical servers and services may also fail. As may be contemplated, power generator 1436 may be made redundant to eliminate that critical dependency and as also may be contemplated, there may, in certain embodiments, be further downstream elements or resources from the power generator which may introduce further full and/or partial dependencies.

Figure 15:
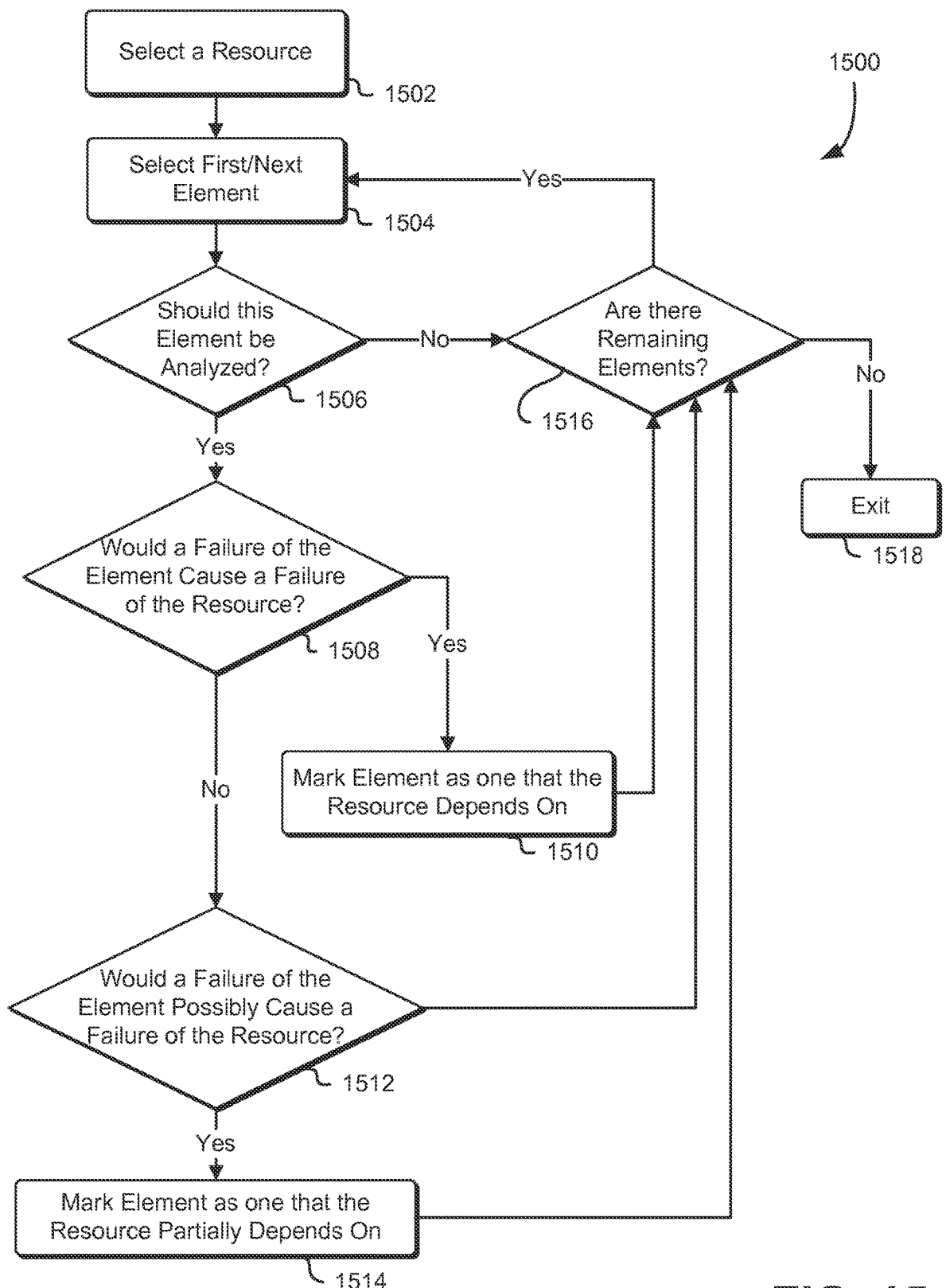
FIG. 15 illustrates an example process for determining which elements or resources of the computing system that a chosen resource or service may depend on in accordance with at least one embodiment.

FIG. 15 illustrates an example process 1500 for analyzing a graph or equivalent representation of a computing system by determining which elements or resources of the computing system that a chosen resource or service may depend on in accordance with at least one embodiment. A resource or element may be selected 1502 from a list of one or more resources or elements in the computing system. The resource or element may be selected according to the type of analysis that is desired or according to a specified order, or according to system need, or according to economic and/or other value or according to a combination of these and/or other criteria. Process 1500 may be performed on a single resource or element in the computing system or may, in some embodiments, be performed on multiple resources or elements in the computing system.

Once a resource is selected, 1504 a first element in the computing system may be selected. The first and subsequent elements may be selected according to a specified order, or according to system need, or according to economic and/or other value or according to a combination of these and/or other criteria. In some embodiments, elements may be selected starting from elements that are immediately downstream of the selected resource and then may be subsequently recursively selected from the elements that are downstream from those selected elements. In some embodiments, elements may be selected sequentially based at least in part on a graph traversal algorithm such as, but not limited to breadth first, depth first and/or other such traversal algorithms. For the selected element, it may be 1506 determined whether the element is one that should be analyzed. In some embodiments, whether an element should be analyzed may depend on whether the element has been marked as one that the resource may depend on, or whether the element has been marked as one that the resource may partially depend on, or may be at least partially based on the type or functionality of the element, or may be at least partially based on the type or functionality of the selected resource, or may be at least partially based on other external and/or internal computing system factors or a may be based at least in part on a combination of these and/or other criteria. In the event 1506 that the selected element does not require analysis, and if 1516 there are remaining elements to analyze, then 1504 a next element may be selected. In the event 1506 that the selected element should be analyzed, it may first be determined 1508 whether the failure of the selected element may cause a failure of the resource.

In some embodiments, the determination of whether a failure of the selected element may cause a failure of the resource may be made by performing one or more of the processes described herein, as described at least in connection with FIGS. 3, 10 and 12 and in accordance with at least one embodiment. In some embodiments, the determination of whether a failure of the selected element may cause a failure of the resource may be determined by analyzing system factors, or by examining and/or analyzing the resource or the selected entity or other system entities, or may be determined by other such factors. In the event 1508 that the failure of the selected element may cause a failure of the resource, the selected element 1510 may be marked as one that the resource depends on and if, 1516 there are remaining elements to analyze, then 1504 a next element may be selected. In the event 1508 that the failure of the selected element may not necessarily lead to a failure of the resource, it may next be determined 1512 whether the failure of the selected element may possibly cause a failure of the resource in some circumstances and/or under some system configurations. In some embodiments, the determination of whether a failure of the selected element may possibly cause a failure of the resource may be made by performing one or more of the processes described herein, as described at least in connection with FIGS. 3, 10 and 12 and in accordance with at least one embodiment. In some embodiments, the determination of whether a failure of the selected element may possibly cause a failure of the resource may be determined by analyzing system factors, or by examining and/or analyzing the resource or the selected entity or other system entities, or may be determined by other such factors. In the event 1512 that the failure of the selected element may possibly cause a failure of the resource, the selected element 1514 may be marked as one that the resource depends on and if, 1516 there are remaining elements to analyze, then 1504 a next element may be selected. If it is determined 1516 that there are no remaining elements to analyze, then 1518 the process may exit.

Figure 16:
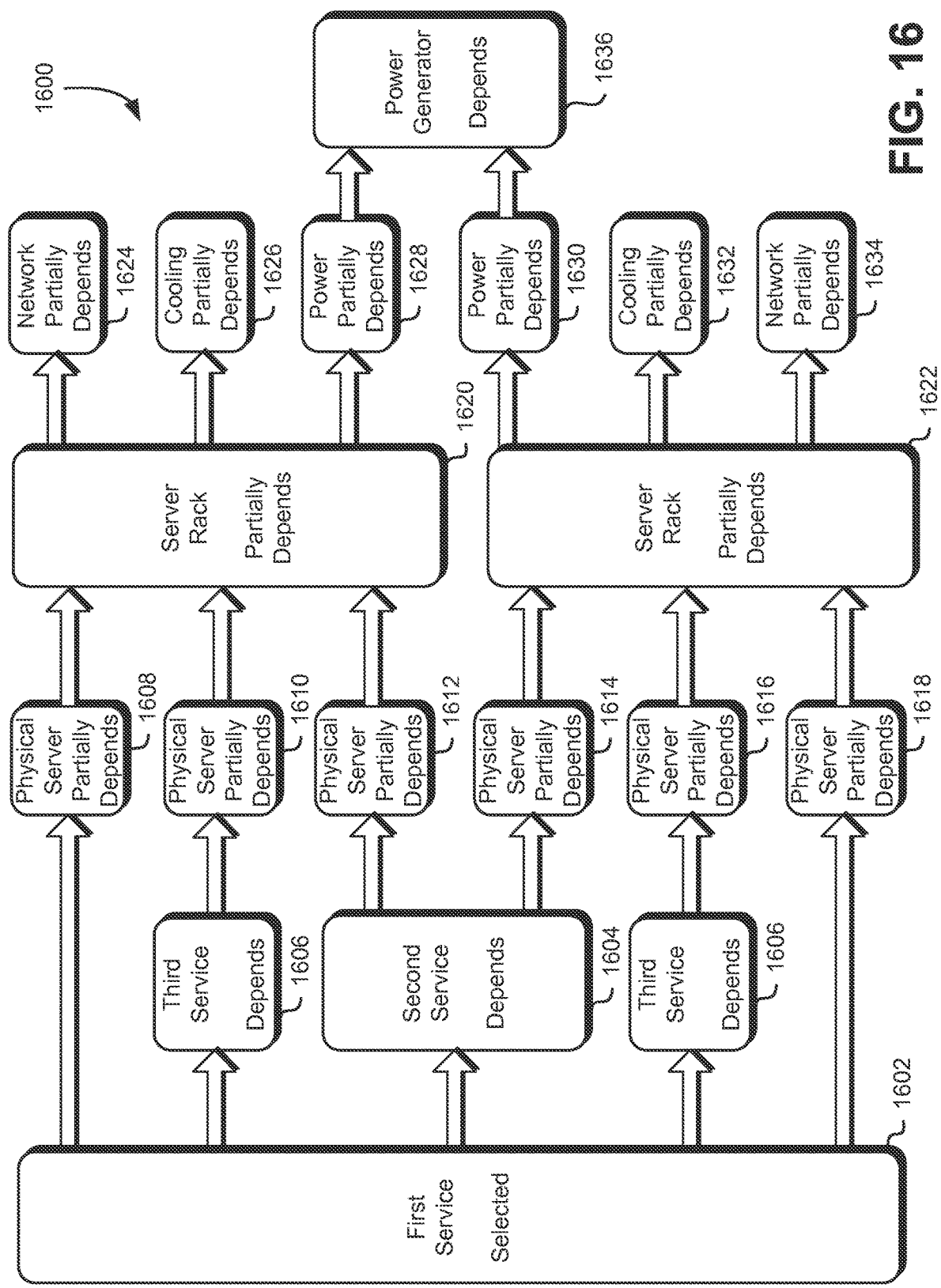
FIG. 16 illustrates an example environment in which the process from FIG. 15 may be applied to an example distributed and/or virtualized computing system in accordance with at least one embodiment.

FIG. 16 illustrates an example environment 1600 showing a result of applying the process 1500 illustrated in FIG. 15 to the example system illustrated in example environment 1400 in FIG. 14, as described at least in connection with FIGS. 1 and 2 and in accordance with at least one environment. In FIG. 16, first service 1602 is selected as the resource. As described herein at least in connection with FIGS. 1, 2 and 14 and in accordance with at least one embodiment, a failure of second service 1604 and/or a failure of third service 1606 may cause a failure of first service 1602. Because of their redundant nature, first service 1602 may only partially depend on physical servers 1608, 1610, 1612, 1614, 1616 and 1618 because as described herein at least in connection with FIGS. 1, 2 and 14 and in accordance with at least one embodiment, failures of some combinations of the physical servers may cause failures of first service 1602, second service 1604 and/or third service 1606, but failures of other combinations of the physical servers may not necessarily cause failures of first service 1602. For example, physical server 1608, physical server 1610 and physical server 1612 may all fail but, first service 1602, second service 1604 or third service 1606 may remain operational because of the availability of redundant physical servers 1614, 1616 and 1618. Server rack 1620 and its immediate downstream elements, network 1624, cooling 1626 and power 1628 may be marked as elements that first service 1602 partially depends on because of the redundancy of server rack 1622. Similarly, server rack 1620 and its immediate downstream elements, network 1634, cooling 1632 and power 1630 may also be marked as elements that first service 1602 partially depends on because of the redundancy of server rack 1620. As may be contemplated and as described herein at least in connection with FIGS. 1, 2 and 14 and in accordance with at least one embodiment, a failure of power generator 1636 may cause a failure of power 1628 and power 1630, leading to a failure in both server racks, all physical servers and all services.

As may be contemplated, process 1500 illustrated in FIG. 15 may also be applied to the representation of a computing system that is more vulnerable to element or resource failures such as the example system illustrated in FIG. 13, as described at least in connection with FIGS. 1 and 2 and in accordance with at least one environment. In such a vulnerable system, more of the elements in the computing system would be marked as elements that the resource may fully depend on. For example, the first service may be fully dependent on both server racks in the example system illustrated in FIG. 13 because the failure of one may cause the failure of the second service as described at least in connection with FIG. 13 and the failure of the other may cause the failure of the third service as described at least in connection with FIG. 13.

Figure 17:
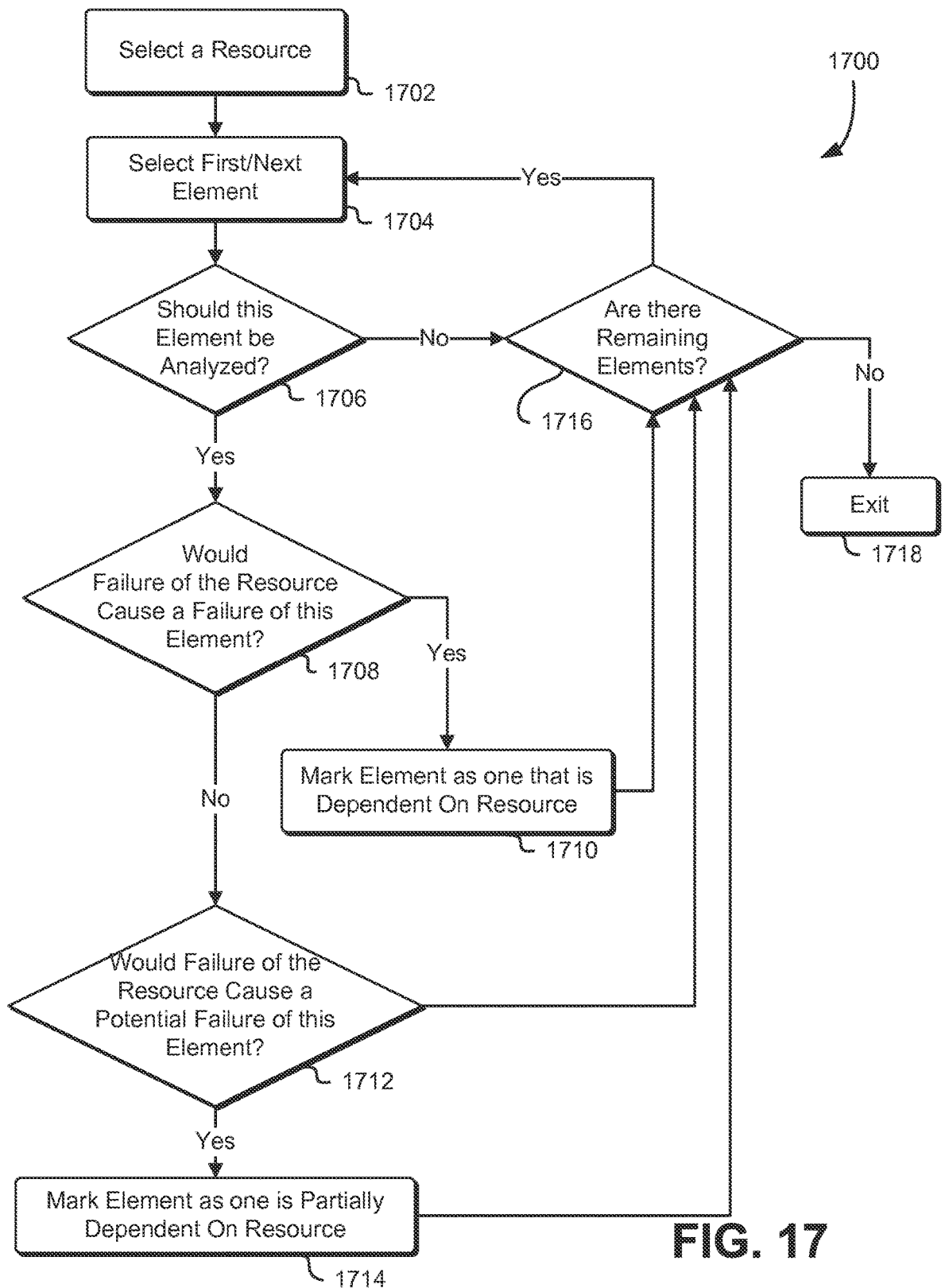
FIG. 17 illustrates an example process for determining which elements or resources of the computing system may depend on a chosen resource or service in accordance with at least one embodiment.

FIG. 17 illustrates an example process 1700 for analyzing a graph or equivalent representation of a computing system by determining which elements or resources of the computing system may depend on a chosen resource or service in accordance with at least one embodiment. A resource or element may be selected 1702 from a list of one or more resources or elements in the computing system. The resource or element may be selected according to the type of analysis that is desired or according to a specified order, or according to system need, or according to economic and/or other value or according to a combination of these and/or other criteria. In some embodiments, the resource may be selected for purposes of analyzing the effects of an intentional and/or deliberate failure of the resource. In some embodiments, the resource may be selected for purposes for analyzing the effects of an unintentional and/or accidental failure of the resource. Process 1700 may be performed on a single resource or element in the computing system or may, in some embodiments, be performed on multiple resources or elements in the computing system. Process 1700 may be considered as similar but not necessarily identical to process 1500. One difference between process 1700 and process 1500 is that process 1700 analyzes elements that are upstream from a chosen resource while process 1500 elements that are downstream from a chosen resource. Elements marked in process 1500 were, for example, elements that a selected resource may depend on and/or were elements that may cause at least a partial failure in the selected resource if those elements were to fail. Elements marked in process 1700 are, for example, elements that depend on a selected resource and/or are elements that may at least partially fail if the selected resource were to fail.

Once a resource is selected, 1704 a first element in the computing system may be selected. The first and subsequent elements may be selected according to a specified order, or according to system need, or according to economic and/or other value or according to a combination of these and/or other criteria. In some embodiments, elements may be selected starting from elements that are immediately upstream of the selected resource and then may be subsequently recursively selected from the elements that are upstream from those selected elements. In some embodiments, elements may be selected sequentially based at least in part on a graph traversal algorithm such as, but not limited to breadth first, depth first and/or other such traversal algorithms. For the selected element, it may be 1706 determined whether the element is one that should be analyzed. In some embodiments, whether an element should be analyzed may depend on whether the element has been marked as one that may be dependent on the resource, or whether the element has been marked as one that may be partially dependent on the resource, or may be at least partially based on the type or functionality of the element, or may be at least partially based on the type or functionality of the selected resource, or may be at least partially based on other external and/or internal computing system factors or may be based at least in part on a combination of these and/or other criteria. In the event 1706 that the selected element does not require analysis, and if 1716 there are remaining elements to analyze, then 1704 a next element may be selected. In the event 1706 that the selected element should be analyzed, it may first be determined 1708 whether the failure of the resource may cause a failure of the selected element.

In some embodiments, the determination of whether a failure of the resource may cause a failure of the selected element may cause a failure of the resource may be made by performing one or more of the processes described herein, as described at least in connection with FIGS. 3, 10 and 12 and in accordance with at least one embodiment. In some embodiments, the determination of whether a failure of the resource may cause a failure of the selected element may be determined by analyzing system factors, or by examining and/or analyzing the resource or the selected entity or other system entities, or may be determined by other such factors. In the event 1708 that the failure of the resource may cause a failure of the selected element, the selected element 1710 may be marked as one that depends on the resource. If 1716 there are remaining elements to analyze, then 1704 a next element may be selected. In the event 1708 that the failure of the resource may not necessarily lead to a failure of the selected element, it may next be determined 1712 whether the failure of the resource may possibly cause a failure of the selected element in some circumstances and/or under some system configurations. In some embodiments, the determination of whether a failure of the resource may possibly cause a failure of the selected element may be made by performing one or more of the processes described herein, as described at least in connection with FIGS. 3, 10 and 12 and in accordance with at least one embodiment. In some embodiments, the determination of whether a failure of the resource may possibly cause a failure of the selected element may be determined by analyzing system factors, or by examining and/or analyzing the resource or the selected entity or other system entities, or may be determined by other such factors. In the event 1712 that the failure of the resource may possibly cause a failure of the selected element, the selected element 1714 may be marked as one that depends on the resource and if, 1716 there are remaining elements to analyze, then 1704 a next element may be selected. If it is determined 1716 that there are no remaining elements to analyze, then 1718 the process may exit.

Figure 18:
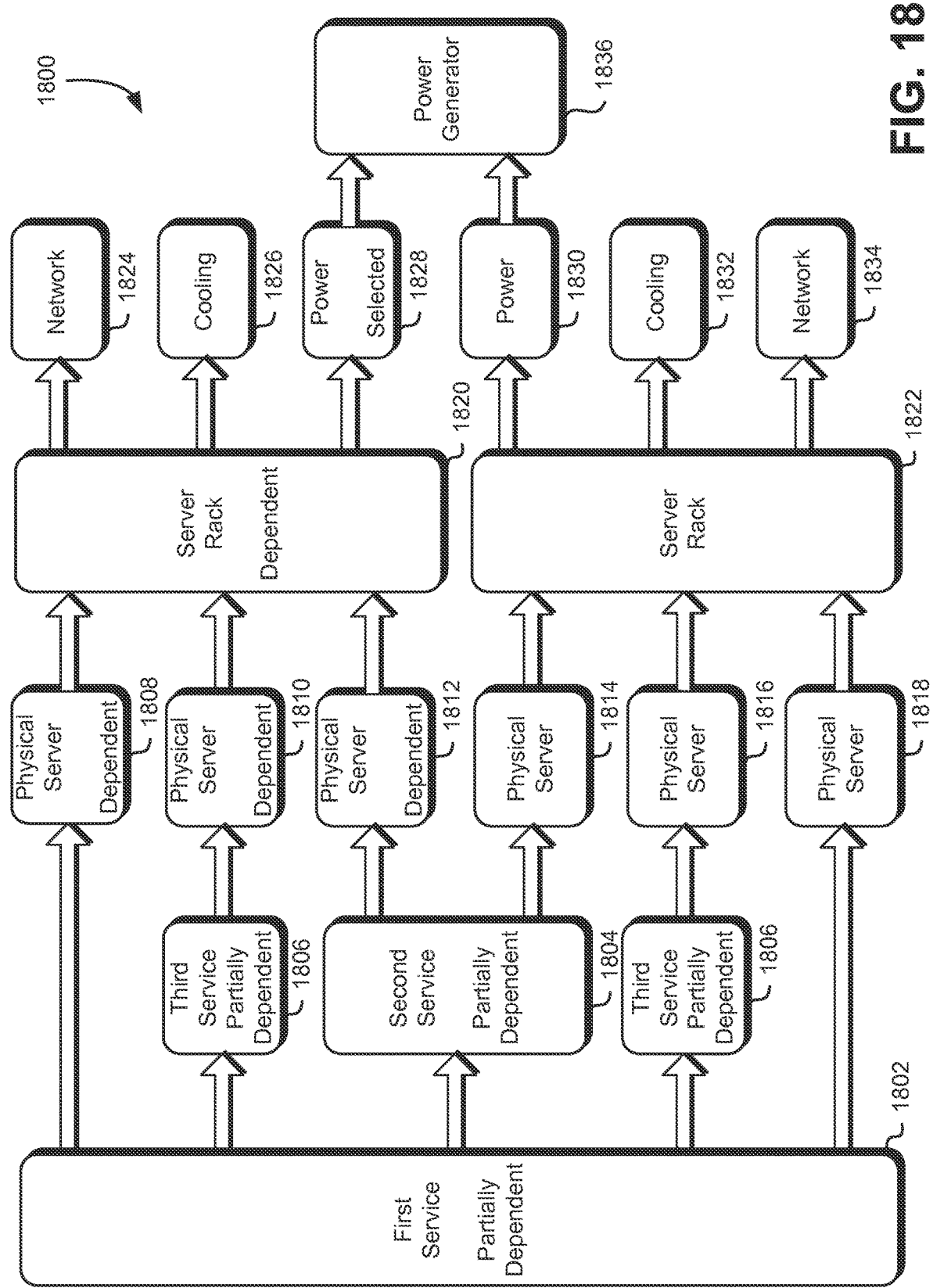
FIG. 18 illustrates an example environment in which the process from FIG. 17 may be applied to an example distributed and/or virtualized computing system in accordance with at least one embodiment.

FIG. 18 illustrates an example environment 1800 showing a result of applying the process 1700 illustrated in FIG. 17 to the example system illustrated in example environment 1400 in FIG. 14 as described at least in connection with FIGS. 1 and 2 and in accordance with at least one environment. In FIG. 18 power unit 1828 is selected as the resource. As described at least in connection with FIG. 17, power unit 1828 may be selected based at least in part on a desire to analyze system dependencies of the power unit. For example, in some embodiments, a technician may need to perform maintenance on the power unit 1828 and may wish to notify users of all dependent systems that the power unit will be shut down. As described herein, at least in connection with FIGS. 1 and 2 and in accordance with at least one embodiment, a shutdown or failure of power unit 1828 may lead to a failure of server rack 1820 and a corresponding failure of physical servers 1808, 1810 and 1812. Because second service 1804 depends on failed physical server 1812 and depends on running physical server 1814, second service 1804 may partially depend on power unit 1828. Because third service 1806 depends on failed physical server 1810 and depends on running physical server 1816, third service 1806 may partially depend on power unit 1828. Note that, in this particular example illustrated in FIG. 18, the bifurcated drawing of third service 1806 is not meant to indicate that there are two instances of the third service. Rather, the third service is a single instance that is drawn this way to clarify the drawing. First service 1802 depends on failed physical server 1808 and also depends on running physical server 1818 and because of these dependencies, first service 1802 may partially depend on power unit 1828. First service 1802 may have multiple partial dependencies on power unit 1828 since first service 1802 depends on second service 1804 and third service 1806, both of which partially depend on power unit 1828. None of the other elements in the computing system, including power generator 1836, network 1824 and 1834, cooling 1826, power 1830, cooling 1832, network 1832, server rack 1822, physical server 1814, physical server 1816 or physical server 1818 are upstream from power unit 1828 may fail as a result of the failure of power unit 1828.

Figure 19:
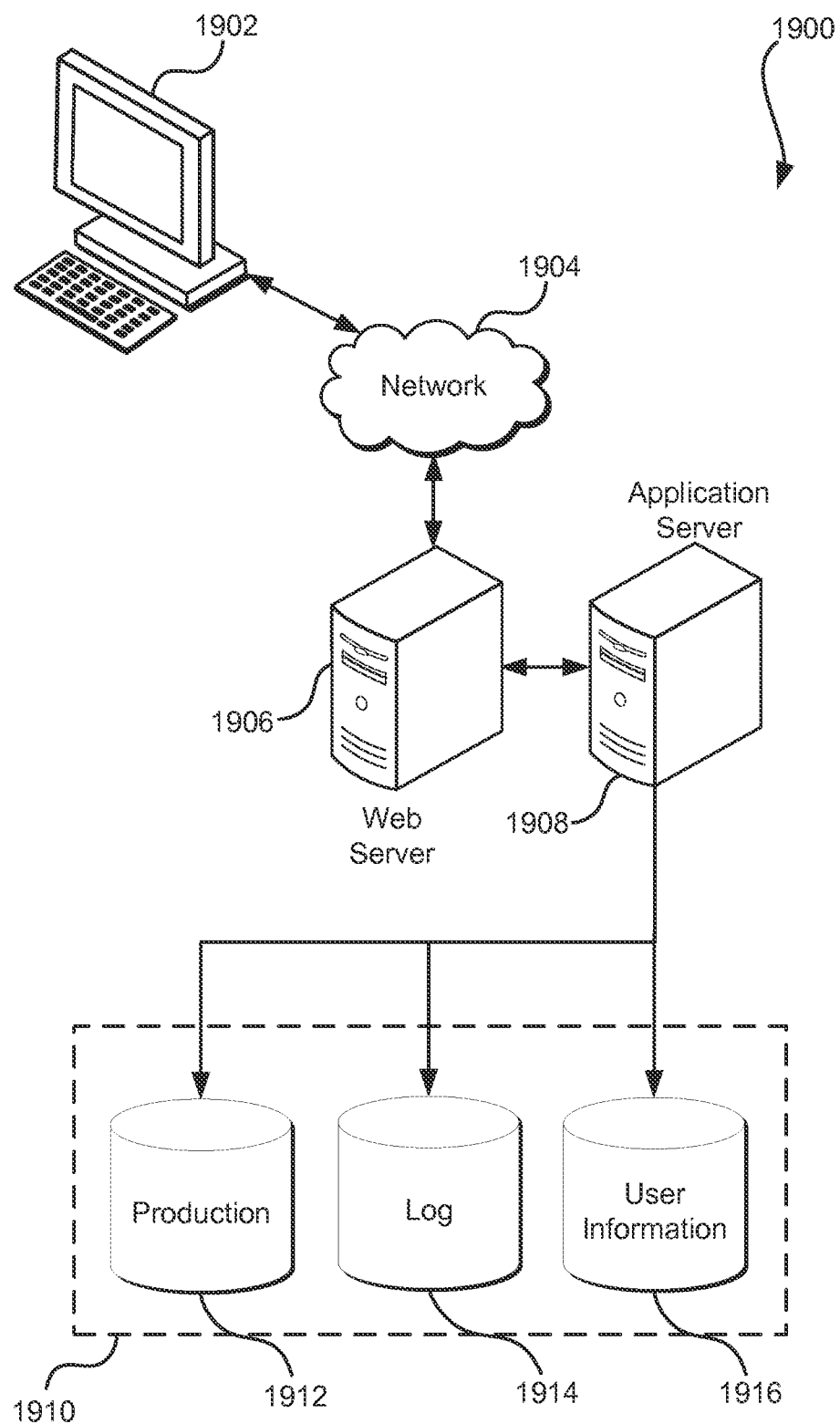
FIG. 19 illustrates an environment in which various embodiments can be implemented.

FIG. 19 illustrates aspects of an example environment 1900 for implementing aspects in accordance with various embodiments. As will be appreciated, although a web-based environment is used for purposes of explanation, different environments may be used, as appropriate, to implement various embodiments. The environment includes an electronic client device 1902, which can include any appropriate device operable to send and receive requests, messages or information over an appropriate network 1904 and convey information back to a user of the device. Examples of such client devices include personal computers, cell phones, handheld messaging devices, laptop computers, tablet computers, set-top boxes, personal data assistants, embedded computer systems, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a web server 1906 for receiving requests and serving content in response thereto, although for other networks an alternative device serving a similar purpose could be used as would be apparent to one of ordinary skill in the art.

The illustrative environment includes at least one application server 1908 and a data store 1910. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling some (even a majority) of the data access and business logic for an application. The application server may provide access control services in cooperation with the data store and is able to generate content such as text, graphics, audio and/or video to be transferred to the user, which may be served to the user by the web server in the form of HyperText Markup Language ("HTML"), Extensible Markup Language ("XML") or another appropriate structured language in this example. The handling of all requests and responses, as well as the delivery of content between the client device 1902 and the application server 1908, can be handled by the web server. It should be understood that the web and application servers are not required and are merely example components, as structured code discussed herein can be executed on any appropriate device or host machine as discussed elsewhere herein. Further, operations described herein as being performed by a single device may, unless otherwise clear from context, be performed collectively by multiple devices, which may form a distributed system.

The data store 1910 can include several separate data tables, databases or other data storage mechanisms and media for storing data relating to a particular aspect of the present disclosure. For example, the data store illustrated may include mechanisms for storing production data 1912 and user information 1916, which can be used to serve content for the production side. The data store also is shown to include a mechanism for storing log data 1914, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 1910. The data store 1910 is operable, through logic associated therewith, to receive instructions from the application server 1908 and obtain, update or otherwise process data in response thereto. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 1902. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 19. Thus, the depiction of the system 1900 in FIG. 19 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C. or any nonempty subset of the set of A and B and C. For instance, in the illustrative example of a set having three members used in the above conjunctive phrase, "at least one of A, B, and C" and "at least one of A, B and C" refers to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C to each be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A computer-implemented method, comprising:
   obtaining a representation of a computing system comprising a plurality of computing system entities, the representation including nodes corresponding to the computing system entities and edges corresponding to dependency relationships between pairs of the computing system entities, the dependency relationships indicating at least partial dependence of a first system entity upon a second system entity and further indicating that the first system entity and second system entity share at least one computing resource to perform their respective operations;
   modifying the representation to determine an improvement to at least one computing system entity of the computing system by at least:
      performing a first simulation on the representation to obtain first information corresponding to a set of failures associated with one or more computing system entities of the plurality of computing system entities;
      altering the representation by at least modifying a dependency relationship between the first system entity and the second system entity to generate an altered representation;
      performing a second simulation on the altered representation to obtain second information corresponding to a second set of failures associated with one or more computing system entities of the plurality of computing system entities; and
      generating a comparison of the first information to the second information based at least in part on the first set of failures and the second set of failures to determine the improvement to the at least one computing system entity of the computing system; and
   providing the comparison indicating the improvement to the at least one computing system entity of the computing system as a result of modifying the representation.

2. The computer-implemented method of claim 1, wherein the computer-implemented method further comprises:
   prior to performing the first simulation, receiving a selection indicating the first system entity and the second system entity; and wherein altering the representation modifies the representation of a set of computing system entities that depend on the first system entity or the second system entity.

3. The computer-implemented method of claim 1, wherein the computer-implemented method further comprises:
prior to performing the first simulation, receiving a selection indicating the first system entity and the second system entity; and
wherein altering the representation modifies the representation of a set of computing system entities that the first system entity or the second system entity depend on.

4. The computer-implemented method of claim 1, wherein modifying the representation further comprises applying a gradient descent algorithm to the representation.

5. The computer-implemented method of claim 1, wherein at least one of the first simulation or the second simulation at least comprises an iterative random number simulation algorithm.

6. The computer-implemented method of claim 1, wherein modifying the representation further comprises applying a simulated annealing algorithm to the representation.

7. The computer-implemented method of claim 1, wherein the computer-implemented method further comprises reconfiguring the system in accordance with the altered representation.

8. The computer-implemented method of claim 1, wherein the plurality of computing system entities include both physical entities and logical entities.

9. A computer system, comprising:
one or more processors; and
memory including executable instructions that, as a result of execution by the one or more processors, cause the computer system to at least:
obtain a representation of a computing system comprising a plurality of computing system entities and one or more dependency relationships between the plurality of computing system entities wherein the representation includes nodes each corresponding to a computing system entity of the plurality of computing system entities and edges corresponding to dependency relationships between pairs of the computing system entities of the one or more dependency relationships, at least one dependency relationship of the one or more dependency relationships indicating at least partial dependence of a first system entity upon a second system entity and further indicating that a failure of a computing resource of the second system entity causes loss of functionality of the first system entity;
perform an analysis of the representation based at least in part on an optimization algorithm, execution of the optimization algorithm includes at least:
performing a set of simulations comprising one or more alterations to the plurality of computing system entities and the one or more dependency relationships included in the representation, at least one alteration of the one or more alterations modifying a dependency relationship between the first system entity and the second system entity; and
determining an improvement to the representation based at least in part on a simulation of the set of simulations where the at least one alteration causes an improvement to a failure rate associated with the first system entity or the second system entity; and
provide information, based at least in part on the analysis, indicating the at least one alteration.

10. The computer system of claim 9, wherein the optimization algorithm further comprises a metaheuristic algorithm.

11. The computer system of claim 9, wherein the optimization algorithm further comprises an iterative numerical optimization algorithm.

12. The computer system of claim 9, wherein the edges of the representation include a weighting factor that represents importance of the corresponding dependency relationship.

13. The computer system of claim 9, wherein altering the representation at least comprises moving nodes and edges from one node to another node.

14. The computer system of claim 9, wherein altering the representation further comprises adding nodes and edges to the representation.

15. A non-transitory computer-readable storage medium storing thereon executable instructions that, as a result of execution by one or more processors of a computer system, cause the computer system to at least:
perform an analysis of a representation of a system in accordance with one or more algorithms by at least:
creating one or more alterations of the representation that modifies at least one node of a set of nodes included in the representation or at least one edge between two or more nodes of the set of nodes;
performing a simulation on the representation including the one or more alterations of the representation, the representation representing a plurality of system entities and one or more relationships between the plurality of system entities, the set of nodes corresponding to the plurality of system entities and set of edges corresponding to relationships between pairs of system entities of the plurality of system entities, the relationships indicating at least partial dependence of a first system entity upon a second system entity and further indicating that the first system entity and the second system entity both depend on one or more operations of at least one resource of the computing system, and a first alteration of the one or more alterations modifying an edge of the set of edges between a first node and a second node of the set of nodes representing the first system entity and the second system entity in the representation; and
determining the simulation provides an improvement to at least one factor of the representation as a result of the first alterations; and
provide information, based at least in part on the analysis, indicating first alteration provides the improvement to the at least one factor.

16. The non-transitory computer-readable storage medium of claim 15, wherein the analysis of the representation is performed on an incomplete portion of the representation.

17. The non-transitory computer-readable storage medium of claim 15, wherein the at least one factor includes at least a reduction in computing system entity failure rates.

18. The non-transitory computer-readable storage medium of claim 15, wherein:
at least a subset of the system entities represented by the set of nodes are suppliers in a supply chain; and
at least a subset of the relationships between pairs of system entities represented by the set of edges are links between the suppliers.

19. The non-transitory computer-readable storage medium of claim 15, wherein:

at least a subset of the system entities represented by the set of nodes are computing system entities; and at least a subset of the relationships between pairs of system entities represented by the set of edges are dependencies between the system entities.

20. The non-transitory computer-readable storage medium of claim 15, wherein:
- at least a subset of the system entities represented by the set of nodes are computing system entities; and
- at least a subset of the relationships between pairs of system entities represented by the set of edges are flows of data relationships between the system entities.

\* \* \* \* \*